US012755789B2

(12) United States Patent
Prakash et al.

(10) Patent No.: US 12,755,789 B2
(45) Date of Patent: Oct. 6, 2026

(54) CONTROL GATE SIGNAL FOR DATA RETENTION IN NONVOLATILE MEMORY

(71) Applicant: Sandisk Technologies, Inc., Milpitas, CA (US)

(72) Inventors: Abhijith Prakash, Milpitas, CA (US); Anubhav Khandelwal, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 232 days.

(21) Appl. No.: 18/790,609

(22) Filed: Jul. 31, 2024

(65) Prior Publication Data

US 2024/0395328 A1 Nov. 28, 2024

Related U.S. Application Data

(60) Division of application No. 18/109,466, filed on Feb. 14, 2023, now Pat. No. 12,087,363, which is a continuation of application No. 17/191,474, filed on Mar. 3, 2021, now Pat. No. 11,605,430.

(51) Int. Cl.

| | |
|---|---|
| ***G11C 16/04*** | (2006.01) |
| ***G11C 16/08*** | (2006.01) |
| ***G11C 16/10*** | (2006.01) |
| ***G11C 16/32*** | (2006.01) |
| ***H10B 41/10*** | (2023.01) |
| ***H10B 41/27*** | (2023.01) |
| ***H10B 43/10*** | (2023.01) |
| ***H10B 43/27*** | (2023.01) |

(52) U.S. Cl.
CPC .......... *G11C 16/08* (2013.01); *G11C 16/0483* (2013.01); *G11C 16/10* (2013.01); *G11C 16/32* (2013.01); *H10B 41/10* (2023.02); *H10B 41/27* (2023.02); *H10B 43/10* (2023.02); *H10B 43/27* (2023.02)

(58) Field of Classification Search
CPC ..... G11C 16/08; G11C 16/0483; G11C 16/10; G11C 16/32; H10B 41/10; H10B 43/10; H10B 41/27; H10B 43/27
USPC ..................................................... 365/185.23
See application file for complete search history.

(56) References Cited

U.S. PATENT DOCUMENTS

| | | | |
|---|---|---|---|
| 7,190,187 | B2 | 3/2007 | Hua et al. |
| 8,437,193 | B1 | 5/2013 | Yang |
| 8,902,669 | B2 | 12/2014 | Yang et al. |
| 9,111,639 | B2 | 8/2015 | Hong et al. |
| 9,418,751 | B1 | 8/2016 | Dutta et al. |
| 10,446,236 | B1 | 10/2019 | Yamada |

(Continued)

*Primary Examiner* — Ly D Pham
(74) *Attorney, Agent, or Firm* — Dickinson Wright PLLC

(57) ABSTRACT

The nonvolatile memory includes a plurality of nonvolatile memory cells configured to store multiple data states; a word line connected to a control gate of at least one of the plurality of non-volatile memory cells; a control gate line to supply a control gate signal; a word line switch connected between the word line and the control gate line to control the potential applied to the word line from the control gate line; and a memory controller circuit. The memory controller circuit is configured to control a word line potential on the word line and a control gate potential on the control gate line and to control a state of the control gate. The memory controller circuit, when the nonvolatile memory transitions to a not-on state, is further configured to turn off the word line switch and to charge the control gate line to a charged potential.

14 Claims, 12 Drawing Sheets

(56) References Cited

U.S. PATENT DOCUMENTS

| | | | |
|---|---|---|---|
| 2008/0239813 | A1 | 10/2008 | Sekar |
| 2011/0122692 | A1 | 5/2011 | Dutta |
| 2012/0008384 | A1 | 1/2012 | Li |
| 2012/0008410 | A1 | 1/2012 | Huynh |
| 2013/0215670 | A1 | 8/2013 | Oda |
| 2016/0099059 | A1 | 4/2016 | Chen |
| 2019/0122737 | A1 | 4/2019 | Huang |
| 2019/0147954 | A1 | 5/2019 | Yip |

CONTROL GATE SIGNAL FOR DATA RETENTION IN NONVOLATILE MEMORY

CROSS REFERENCE TO RELATED APPLICATIONS

This U.S. Divisional Patent Application claims the benefit of co-pending U.S. patent Ser. No. 18/109,466, filed Feb. 14, 2023, and entitled "CONTROL GATE SIGNAL FOR DATA RETENTION IN NONVOLATILE MEMORY," and U.S. patent application Ser. No. 17/191,474, filed Mar. 3, 2021, and entitled "CONTROL GATE SIGNAL FOR DATA RETENTION IN NONVOLATILE MEMORY," the entire disclosure of these applications being considered part of the disclosure of this application and hereby incorporated by reference.

BACKGROUND

The present technology relates to the operation of memory devices. Semiconductor memory devices have become more popular for use in various electronic devices. For example, non-volatile semiconductor memory is used in cellular telephones, digital cameras, personal digital assistants, mobile computing devices, non-mobile computing devices and other devices. Memory devices always strive for improved efficiency, speed of operation, and data retention.

SUMMARY

Various embodiments are described herein for operating a nonvolatile memory, e.g., a NAND, a BICOS memory or the like. A memory can include a memory control circuitry and a plurality of memory cells to store data. The memory control circuitry is configured to charge the control gate lines when the memory is being placed in a passive mode or an OFF mode and after the word line selection switches are off.

In an example embodiment, a nonvolatile memory includes a plurality of nonvolatile memory cells configured to store multiple data states; a word line connected to a control gate of at least one of the plurality of non-volatile memory cells; a control gate line to supply a control gate signal; a word line switch connected between the word line and the control gate line to control the potential applied to the word line from the control gate line; and a memory controller circuit. The memory controller circuit is configured to control a word line potential on the word line and a control gate potential on the control gate line and to control a state of the control gate. The memory controller circuit, when the nonvolatile memory transitions to a not-on state, is further configured to turn off the word line switch and to charge the control gate line to a charged potential.

In an example embodiment, the control gate line at the charged potential reduces leaked charge from the word line through the word line switch to the control gate line.

In an example embodiment, the memory controller circuit is configured to control the state of the nonvolatile memory including placing the nonvolatile memory in at least one of an active mode, a passive mode, or an off mode and charge the control gate line after the word line switch is non-conductive when transitioning from an active mode to one of the passive mode or the off mode.

In an example embodiment, the word line is maintained at a high potential in the active mode and the control gate line is charged to non-zero voltage when transitioning to either the passive mode or the off mode.

In an example embodiment, the high voltage is about four volts to about five volts.

In an example embodiment, the non-zero is up to eight volts.

In an example embodiment, the control gate line is floated in the passive mode or off mode.

In an example embodiment, the control gate line is floated in the not-ON state after being charged to the charged potential.

In an example embodiment, the control gate line at the charged potential reduces leaked charge from the word line through the word line switch to the control gate line.

In an example embodiment, a nonvolatile memory control method is described that can enact any of the preceding functions of the memory.

In an example embodiment, the method includes programming nonvolatile memory cells during an active mode using a word line signal, receiving a signal to transition to a non-active mode, determining that word line switches are off, charging a control gate line to a non-zero potential, and after charging the control gate line, transition to a non-active mode.

In an example embodiment, charging the control gate line operates to delay charge leakage of the word line.

In an example embodiment, the non-active mode is a passive mode, and the method further includes re-charging the control gate line when a control parameter is met.

In an example embodiment, the control parameter is a refresh time period.

In an example embodiment, the control parameter is a voltage refresh threshold.

In an example embodiment, a method of delaying charge leakage in a word line of a nonvolatile memory includes storing data in a plurality of nonvolatile memory cells configured to store a multiple states, using a word line to access selected ones of the non-volatile memory cells, supplying a control gate signal on a control gate line, and controlling the conductivity of a word line switch connected between the word line and the control gate line to control the potential applied to the word line from the control gate line. In an example embodiment, when entering a non-ON mode, the method places all of word line switches in a nonconducting state and charges the control gate line to a charged potential.

In an example embodiment, charging the control gate line acts to reduce leaked charge from the word line through the word line switch to the control gate line.

In an example embodiment, charging the control gate line includes floating the control gate line when the memory is in the non-ON mode.

In an example embodiment, the non-ON mode is a passive mode, and further comprising re-charging the control gate line when a control parameter is met.

In an example embodiment, the non-ON state is a passive state and further comprising placing all of word line switches in an OFF state.

In an example embodiment, the non-ON state is an OFF state and further comprising placing all of word line switches in a floating state.

BRIEF DESCRIPTION OF THE DRAWINGS

A more particular description is included below with reference to specific embodiments illustrated in the appended drawings. Understanding that these drawings depict only certain embodiments of the disclosure and are not, therefore, to be considered limiting of its scope, the disclosure is described and explained with additional specificity and detail through the use of the accompanying drawings, in which.

DETAILED DESCRIPTION

Figure 1:
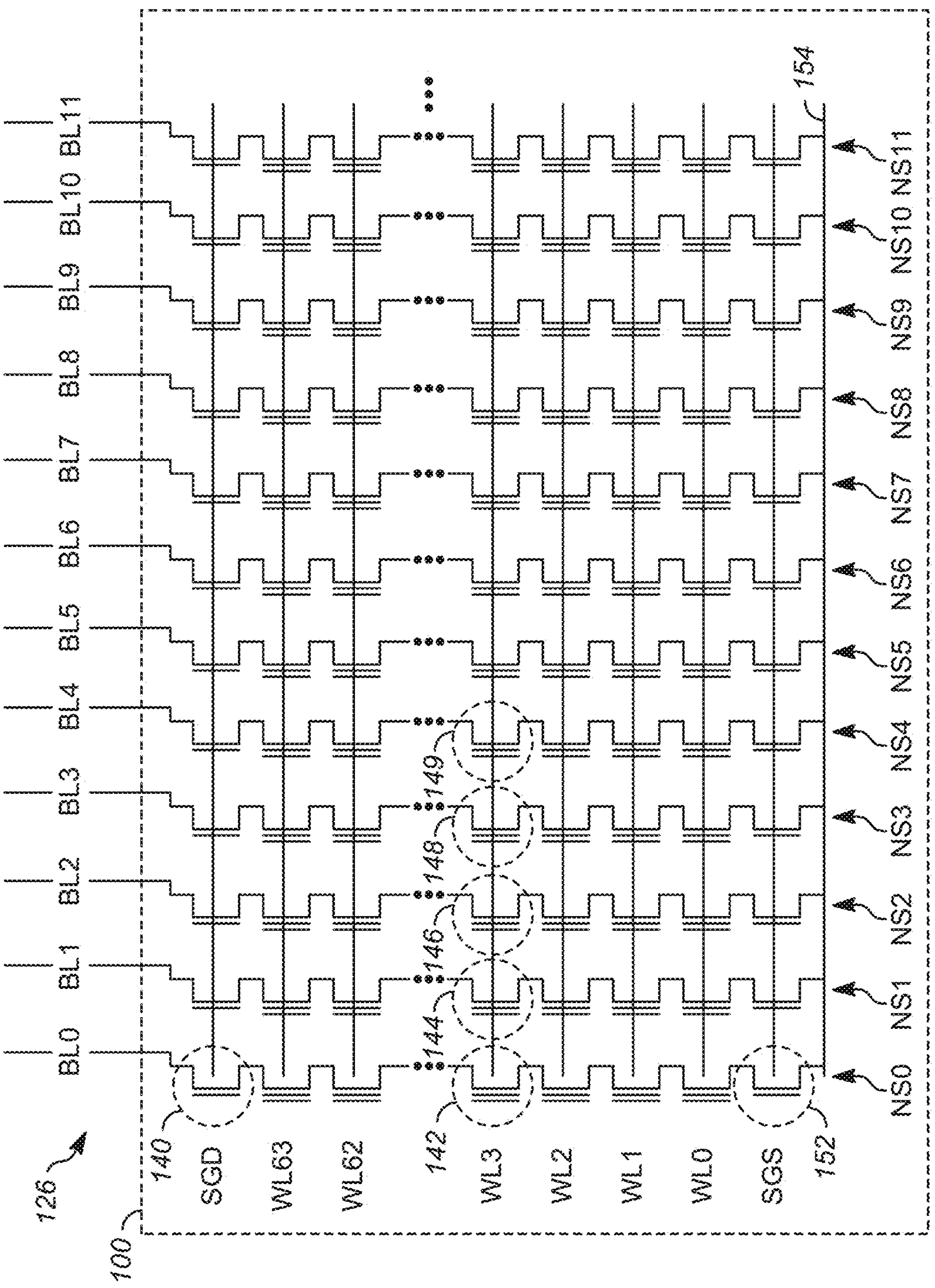
FIG. 1 illustrates an embodiment of an array of memory cells including bit and word lines according to an example embodiment.

Systems and methods are described for controlling the data retention and program operations of nonvolatile memory to improve data retention. Embodiments herein describe controlling the control gate and word line voltage levels to reduce data loss through charge leakage, e.g., during a passive mode or power off mode.

A programming operation for a group of memory cells typically involves providing the memory cells in an erased state and then applying a series of program pulses to the memory cells. Each program pulse is provided in a program loop, also referred to as a program and verify iteration. For example, the program pulse may be applied to a word line that is connected to control gates of the memory cells. In one approach, incremental step pulse programming is performed, in which the program pulse amplitude is increased by a step size in each program loop. Verify operations may be performed after each program pulse to determine whether the memory cells have completed programming.

It has been newly observed that residual word line (WL) potentials play a very important role in determining data retention of the memory cells. Below voltage threshold (Vt) distributions on multiple level memory cells arranged in blocks, e.g., quad level (QLC) blocks (e.g., 1.5 k cycled) show that the first read data retention shows a significantly worse tail behavior compared to the second or subsequent read data retention due. It has been recognized that this is due to zero residual potential (voltage level) on the word line.

When the memory chip is powered-on and is in the active mode, refresh reads could be performed to keep the residual word line (WL) potentials high. But, when the chip is powered off or goes to a mode where background operations are not performed (e.g., a type of passive mode), residual word line (WL) potentials are discharged and read refresh cannot be performed. As a result, the Vt distribution broadens, especially for higher states, with a spread-over lower tail. Unlike the second read situation, failed bit counts (FBC) due to data retention cannot be improved by just one refresh after power-on or after returning to an active mode, since data retention deals with charge loss. Hence, this disclosure recognizes the need to avoid discharge of residual word line (WL) potentials for as long as possible even during power-off or when the chip is in a passive mode in which no background operations for data retention are performed.

Embodiments described herein can charge the control gate lines with a voltage spike just before power-off or entry into a passive mode. This may improve data retention during these modes as explained below to improve power-off DR. For example, immediately prior to the chip being powered off or going into a passive mode (where background operations such as read refresh are not performed), a check of all block select (BLKSEL) transistors being turned off, and then the potentials on control gate (CG) lines are set to a high value VCG_POFF (e.g., but not limited to ~4V or ~8V) for a short duration. Then, the chip is powered down (passive mode) or powered off. This results in the control gate (CG) lines being floated to a high voltage state with no background operations being performed. As a result, a leakage path for charge on the word lines through the pass gates is blocked and word line potentials stay higher for longer. For an extended time period, the charge on control gate lines can also leak away, but such leakage takes much longer due to the charge on the control gate lines.

Each memory cell may be associated with a memory state according to write data in a program command. As used herein, a "memory state" is a detectable characteristic of a memory cell (e.g., a threshold voltage of a NAND memory cell, a resistance of a ReRAM memory cell, a magnetization state of a magnetoresistive random access memory, etc.) that may be used to represent a data value, such as a binary data value, including more than one binary bit. As used herein, the detectable characteristic of a memory cell used to represent a data value is referred to as a "programming characteristic." Based on write data in a program command, a memory cell will either remain in the erased state or be programmed to a memory state (a programmed memory state) different from the erased state.

For example, in a two-bit per cell (MLC) memory device, there are four memory states including the erased state and three programmed memory states. In a three-bit per cell (TLC) memory device, there are eight memory states including the erased state and seven programmed memory states. In a four-bit per cell (QLC) memory device, there are sixteen memory states including the erased state and fifteen programmed memory states. These memory states when stored in nonvolatile memory may be subject to data retention issues when the memory is in a power-off mode or a passive mode from a word line charge leaking through the pass transistor that connects the control gate line and the word line. Charging the control gate line to a high level before shutting down or entering passive mode lessens the potential difference between the control gate line and the word line. Reducing the potential difference and allowing the control gate to float will minimize or delay the charge leakage from the word line.

The embodiments described herein can improve power-off data retention, which can be useful especially at end of life of the device. The present data retention methodology can be useful for some realistic cases where good power-off/passive data retention for a few hours or more is desired. This methodology provides an option for systems to not do a background operation such as 'refresh read' during an idle time when powered on. The present methodology can also assist in reducing failure rate, increasing yield and reducing error correction code (ECC) frequency.

FIG. 1 depicts an embodiment of memory arranged as NAND flash memory cells in a memory array 126. As used herein, the term "memory" denotes semiconductor memory. Types of semiconductor memory include volatile memory and non-volatile memory. Non-volatile memory allows information to be stored and retained even when the non-volatile memory is not connected to a source of power (e.g., a battery). Examples of non-volatile memory include flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), spin-transfer torque magnetic random access memory (STT-RAM or STT-MRAM), resistive random access memory (e.g., ReRAM or RRAM) and phase change memory (e.g., PRAM or PCM). Non-volatile memory can be BiCS memory architecture. Non-volatile memory includes one or more memory cells. A "memory cell" is an electronic device or component capable of storing electronic information. In an embodiment, non-volatile memory utilizes floating-gate transistors or charge trap transistors as memory cells. The ability to adjust the threshold voltage of a floating-gate transistor or charge trap transistor allows the transistor to act as a non-volatile storage element or memory cell, such as a single-level cell (SLC). However, in some cases more than one data bit per memory cell (e.g., a multi-level cell) can be provided by programming and reading multiple threshold voltages or threshold voltage ranges, including a multi-level cell (MLC) (2 bits-per-cell), a triple level cell (TLC) (3 bits-per-cell), a quad-level cell (QLC) (4 bits-per-cell), and so forth.

The memory array 126 can include many blocks of memory. A "block of memory" is a set of memory cells. For example, a block of memory (e.g., an array of memory cells) includes memory cells arranged in word lines and bit lines. A "sub-block" of memory is a subset of a block of memory. For instance, a sub-block is a subset of memory cells corresponding to a subset of the word lines of a block of memory. In an embodiment, a sub-block includes fifty word lines in a block of memory, where the block of memory includes more than fifty word lines. A sub block can denote a physical sub-block, a logical sub-block, or both. A block of memory includes two or more sub-blocks. In an embodiment, memory is structured as two-dimensional (2D) NAND. In another embodiment, memory is structured as three-dimensional (3D) NAND. In an embodiment, one or more of the components described herein (e.g., memory die, memory, block, sub-block, memory cells, circuits, controllers, and/or non-volatile storage systems) are implemented with one or more elements (e.g., transistors, resistors, capacitors, inductors, and/or conductors) in integrated circuitry.

An illustrative block of memory (or block) 100, as shown in FIG. 1, includes a number of NAND strings NS0 to NS11 and respective bit lines (e.g., BL0 to BL11, which are shared among the blocks). Each NAND string is connected at one end to a drain select gate (SGD), and the control gates of the drain select gates are connected via a common SGD line. Each NAND string is connected at its other end to a source select gate (SGS) which, in turn, is connected to a common source line 154. For example, NS0 includes a source side select gate transistor 152 and a drain side select gate transistor 140. Example storage elements 142, 144, 146, 148, and 149 are in NS0 to NS4, respectively, and are connected to a word line WL3. For example, WL3 could be a selected word line which is selected for programming and the example storage elements can be selected storage elements which are selected for programming. Other storage elements connected to WL3 can also be selected storage elements. Sixty-four word lines, for example, WL0-WL63, extend between the source-side select gates and the drain-side select gates. The word lines WL0-WL63 can each be electrically connected to one or more control gate lines through an associated word line selection switch. The control gate lines can be precharged with the voltage charge level required at the word line for the next operation, e.g., read, program or erase. The word line switch electrically connects the control gate line to the word line and is controlled between its conducting state and its nonconducting state by the memory controller circuitry.

Other types of non-volatile memory in addition to NAND flash memory can also be used. For example, another type of memory cell useful in flash EEPROM systems utilizes a nonconductive dielectric material in place of a conductive floating gate to store charge in a nonvolatile manner. In an embodiment, triple layer dielectric formed of silicon oxide, silicon nitride, and silicon oxide (ONO) is sandwiched between a conductive control gate and a surface of a semi-conductive substrate above the memory cell channel. The cell is programmed by injecting electrons from the cell channel into the nitride, where they are trapped and stored in a limited region. This stored charge then changes the voltage level of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor. Another type of memory uses a metallic (conductive) charge storage element in a NAND architecture.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit is localized in the dielectric layer adjacent to the source. Multi-state data storage is obtained by separately reading binary states of the spatially separated charge storage regions within the dielectric. Other types of non-volatile memory are also known. In an alternative embodiment, resistance levels rather than threshold voltage levels can be stored and sensed.

Figure 2:
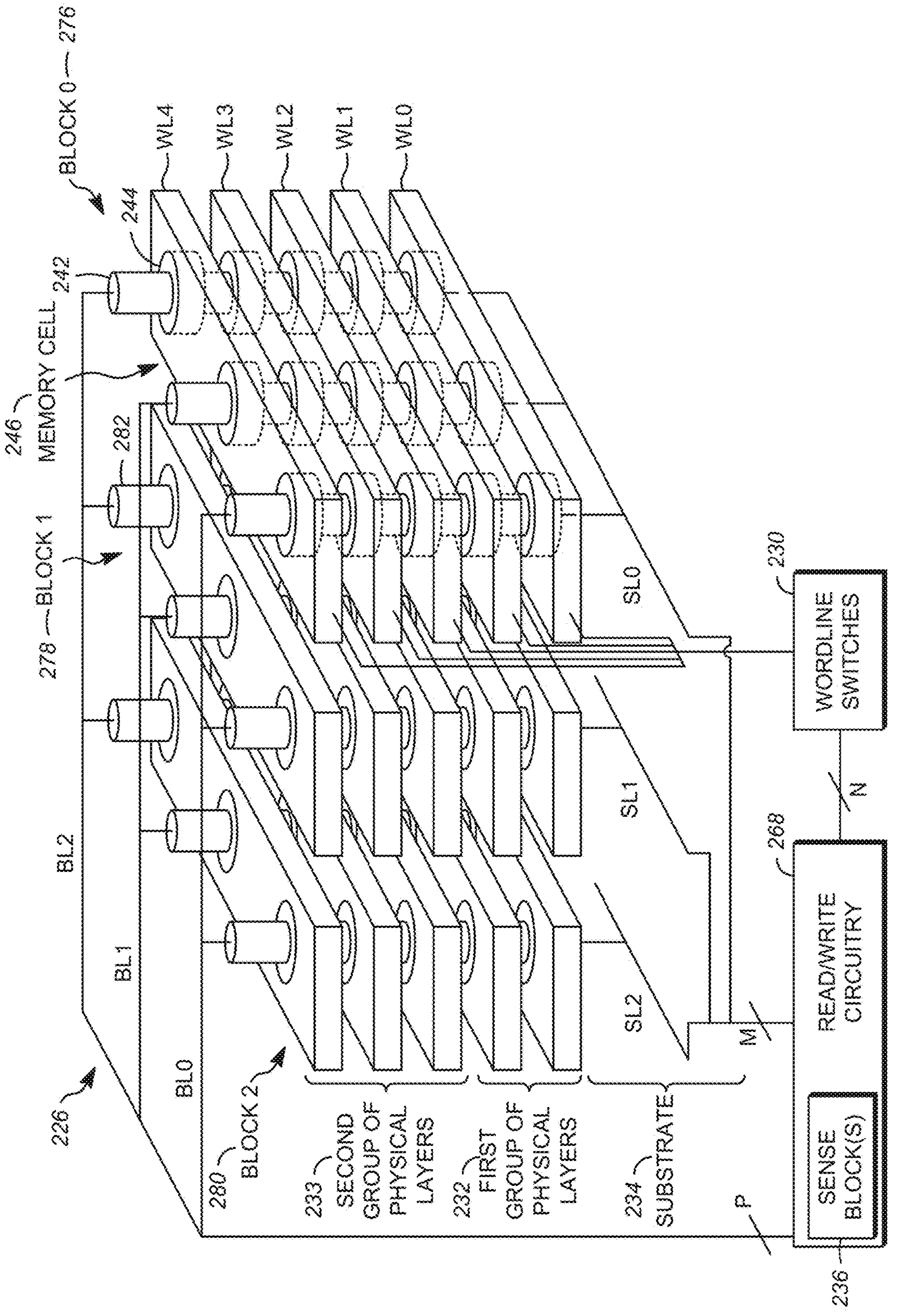
FIG. 2 illustrates a diagram of a three-dimensional (3D) memory in a NAND configuration according to an example embodiment.

FIG. 2 illustrates an embodiment of 3D memory 226 in a NAND flash configuration. The 3D memory 226 includes multiple physical layers that are monolithically formed above a substrate 234, such as a silicon substrate. Storage elements (e.g., memory cells), such as a representative memory cell 246, are arranged in arrays in the physical layers.

The representative memory cell 246 includes a charge trap structure 244 between a word line/control gate WL4 and a conductive channel 242. Charge can be injected into or drained from the charge trap structure 244 via biasing of the conductive channel 242 relative to the word line WL4. For example, the charge trap structure 244 can include silicon nitride and can be separated from the word line WL4 and the conductive channel 242 by a gate dielectric, such as a silicon oxide. An amount of charge in the charge trap structure 244 affects an amount of current through the conductive channel 242 during a read operation of the memory cell 246 and indicates one or more bit values that are stored in the memory cell 246.

The 3D memory 226 includes multiple erase blocks, including a first block (block 0) 276, a second block (block 1) 278, and a third block (block 2) 280. Each block 276, 278, 280 includes a "vertical slice" of the physical layers that includes a stack of word lines, illustrated as a first word line WL0, a second word line WL1, a third word line WL2, a fourth word line WL3, and a fifth word line WL4. Multiple conductive channels (having a substantially vertical orientation, as shown in FIG. 2) extend through the stack of word lines. Each conductive channel is coupled to a storage element in each word line WL0-WL4, forming a NAND string of storage elements. FIG. 2 illustrates three blocks 276, 278, 280, five word lines WL0-WL4 in each block 276, 278, 280, and three conductive channels in each block 276, 278, 280 for clarity of illustration. However, the 3D memory 226 can have more than three blocks, more than five word lines per block, and more than three conductive channels per block. Again the word lines are electrically connected to control gate lines through a word line selection switch.

Read/write circuitry 268 (which can be part of controller circuitry) is coupled to the conductive channels via multiple conductive lines, illustrated as a first bit line BL0, a second bit line BL1, and a third bit line BL2 at a first end of the conductive channels (e.g., an end most remote from the substrate 234) and a first source line SL0, a second source line SL1, and a third source line SL2 at a second end of the conductive channels (e.g., an end nearer to or within the substrate 234). The read/write circuitry 268 is illustrated as coupled to the bit lines BL0-BL2 via "P" control lines, coupled to the source lines SL0-SL2 via "M" control lines, and coupled to the word lines WL0-WL4 via "N" control lines. Each of P, M, and N can have a positive integer value based on the specific configuration of the 3D memory 226. In the example shown in FIGS. 2, P=3, M=3, and N=5. A plurality of word line switches are provided to connect a control line from the read/write circuitry to the word lines WL. The control gate lines can be precharged to a voltage level needed for the next operation on selected word lines WL with the word line switches in a non-conducting state. The word lines can be charged to an unselected level or to a selected level, depending on the state of the control lines, when the word line switches are in the conducting state.

In a particular embodiment, each of the bit lines BL0-BL2 and each of the source lines SL0-SL2 can be coupled to the same end (e.g., the first end or the second end) of different conductive channels. For example, a particular bit line BL0-BL2 can be coupled to a first end of a conductive channel 282 and a particular source line can be coupled to a first end of the conductive channel 242. A second end of the conductive channel 282 can be coupled (e.g., electrically coupled) to a second end of the conductive channel 242. Accordingly, the conductive channel 282 and the conductive channel 242 can be coupled in series and can be coupled to the particular bit line BL0-BL2 and the particular source line SL0-SL2, each of which is coupled to a particular NAND string.

Although each of the conductive channels, such as the conductive channels 242, 282, is illustrated as a single conductive channel, each of the conductive channels can include multiple conductive channels that are in a stack configuration. The multiple conductive channels in a stacked configuration can be coupled by one or more connectors. Additionally, an etch stop layer (not illustrated in FIG. 2) having a conductive connector coupled to physically proximate portions of a conductive channel can be included in the multiple conductive channels, such as between the first group of physical layers 232 and the second group of physical layers 233. Additionally, or alternatively, one or more sub-block gate transistors (not illustrated in FIG. 2) can be coupled between the first group of physical layers 232 and the second group of physical layers 233.

In an embodiment, the first group of physical layers 232 is an example of a first sub-block and the second group of physical layers 233 is an example of a second sub-block. For example, each sub-block (e.g., "word line-based" sub-blocks) can include memory cells corresponding to a subset of word lines WL0-WL4. In an alternative embodiment, each sub-block (e.g., "string-based" sub-blocks) can include memory cells corresponding to a subset of strings (e.g., NAND strings), and can have, for example, common source lines SL0-SL2, but not common bit lines BL0-BL2 or vice versa.

The read/write circuitry 268 facilitates and/or effectuates read and write operations performed on the 3D memory 226. For example, data can be stored to storage elements coupled to a word line WL0-WL4 and the read/write circuitry 268 can read bit values from the storage elements (e.g., memory cells) using one or more sense blocks 236. As another example, the read/write circuitry 268 can apply selection signals to control lines coupled to the word lines WL0-WL4, the bit lines BL0-BL2, and the source lines SL0-SL2 to cause a programming voltage (e.g., a voltage pulse or series of voltage pulses) to be applied across selected storage element(s) of the selected word line (e.g., the fourth word line WL4). The read/write circuitry 226 can also perform verify operations as part of the programming operation. The control gate lines coming from the controller circuitry are connected to the word lines by word line switches 230

The read/write circuitry 268 includes one or more sense blocks 236. The sense blocks 236 are utilized to read or sense one or more values stored in a memory cell. In one approach, one sense block 236 is provided for a group of NAND strings, each of which is coupled to a particular bit line BL0-BL2. For example, a sense block 236 is associated with BL0. Another sense block 236 is associated with BL1, and yet another sense block 236 is associated with BL2. Each sense block 236 can include a memory controller (not illustrated in FIG. 2). Each sense block 236 also includes a sense module for each NAND string. Alternatively, a sense block 236 can be coupled to an interval of bit lines, such as even or odd numbered bit lines.

During a read operation, a controller can receive a request from a host device, such as a computer, smartphone, or laptop computer. The controller can cause the read/write circuitry 268 to read bits from particular storage elements of the 3D memory 226 by applying appropriate signals to the control lines to cause storage elements of a selected word line to be sensed. Accordingly, the 3D memory 226 having multiple conductive channels in a stacked configuration can be configured to read from and write data to one or more storage elements.

One or more subblocks of memory cells 246 in an array of memory cells 246 can be coupled by a channel (e.g., a physical communication channel). In an embodiment, the channel comprises a bit line BL0-BL2 and/or a source line SL0-SL2.

Figure 3:
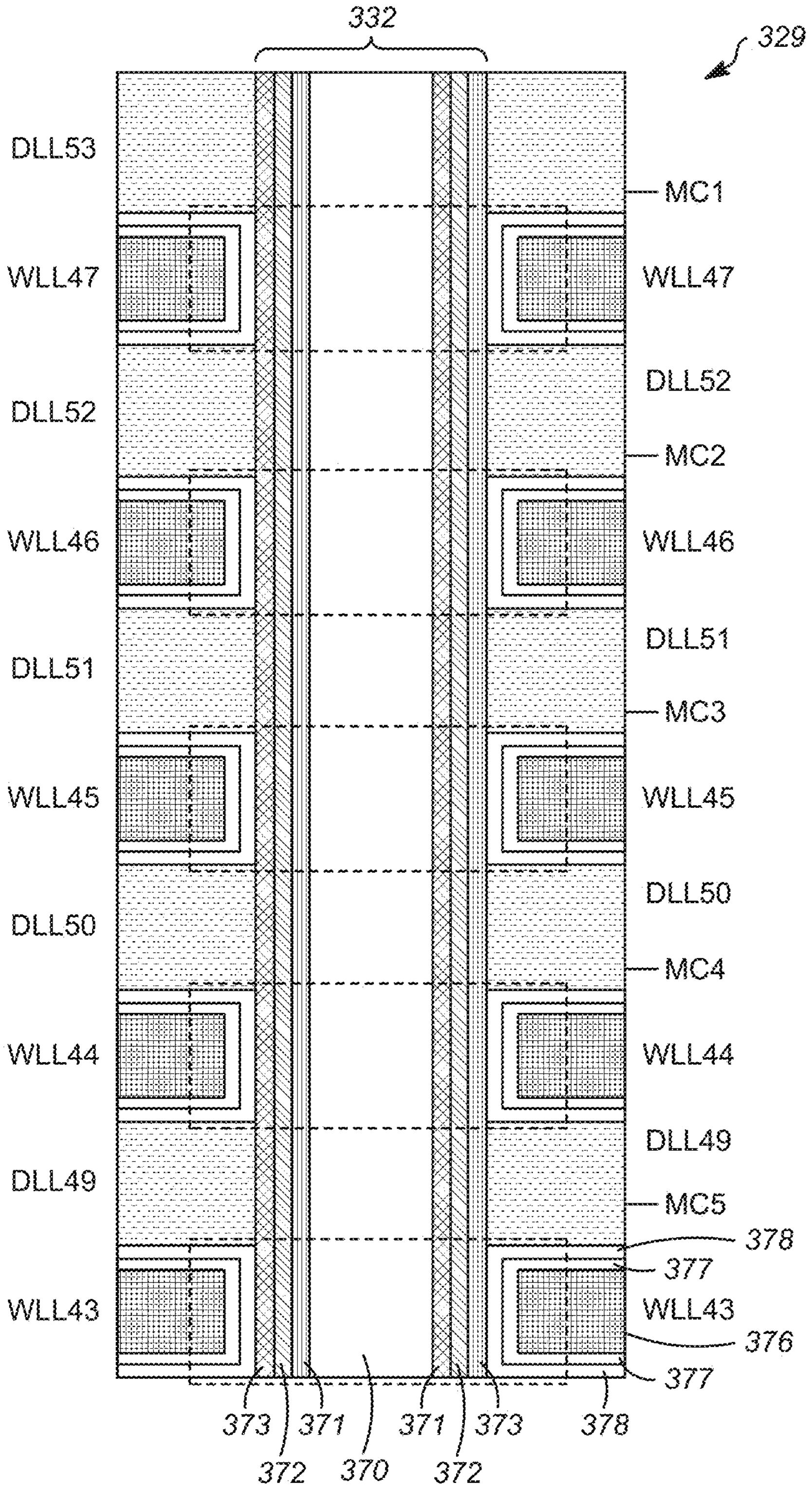
FIG. 3 illustrates a schematic block diagram illustrating an embodiment of a 3D vertical memory structure according to an example embodiment.

FIG. 3 illustrates one embodiment of a cross-sectional view of a 3D, vertical memory structure or string 329. In one embodiment, the vertical column 332 is round and includes four layers; however, in other embodiments more or less than four layers can be included, and other shapes can be used (e.g., a "U" shape instead of an "I" shape or the like). In one embodiment, a vertical column 332 includes an inner core layer 370 that is made of a dielectric, such as SiO2. Other materials can also be used. Surrounding the inner core or inner core layer 370 is a polysilicon channel 371. Materials other than polysilicon can also be used. Note that it is the channel 371 that connects to the bit line. Surrounding the channel 371 is a tunneling dielectric 372. In one embodiment, the tunneling dielectric 372 has an ONO structure. Surrounding the tunneling dielectric 372 is a shared charge-trapping layer 373, such as (for example) Silicon Nitride. Other materials and structures can also be used. The technology described herein is not limited to any particular material or structure.

FIG. 3 depicts dielectric layers DLL49, DLL50, DLL51, DLL52, and DLL53, as well as word line layers WLL43, WLL44, WLL45, WLL46, and WLL47. Each of the word line layers includes a word line region 376 surrounded by an aluminum oxide layer 377, which is surrounded by a blocking oxide (SiO2) layer 378. The physical interaction of the word line layers with the vertical column 332 forms the memory cells. Thus, a memory cell, in one embodiment, comprises the channel 371, tunneling dielectric 372, charge-trapping layer 373 (e.g., shared with other memory cells), blocking oxide layer 378, aluminum oxide layer 377, and the word line region 376. In some embodiments, the blocking oxide layer 378 and aluminum oxide layer 377 can be replaced by a single layer of material with insulating properties or by more than two layers of different material with insulating properties. Furthermore, the materials used are not limited to silicon dioxide (SiO2) or aluminum oxide. For example, word line layer WLL47 and a portion of vertical column 332 comprise a memory cell MC1. Word line layer WLL46 and a portion of vertical column 332 comprise a memory cell MC2. Word line layer WLL45 and a portion of vertical column 332 comprise a memory cell MC3. Word line layer WLL44 and a portion of vertical column 332 comprise a memory cell MC4. Word line layer WLL43 and a portion of vertical column 332 comprise a memory cell MC5. In other architectures, a memory cell can have a different structure, however, the memory cell would still be the storage unit.

When a memory cell is programmed, electrons are stored in a portion of the charge-trapping layer 373 that is associated with the memory cell. These electrons are drawn into the charge-trapping layer 373 from the channel 371, through the tunneling dielectric 372, in response to an appropriate voltage on the word line region 376. The threshold voltage (Vt) of a memory cell is increased in proportion to the amount of stored charge. In one embodiment, the programming is achieved through Fowler-Nordheim tunneling of the electrons into the charge-trapping layer. During an erase operation, the electrons return to the channel or holes are injected into the charge-trapping layer to recombine with electrons. In one embodiment, erasing is achieved using hole injection into the charge-trapping layer via a physical mechanism such as gate induced drain leakage (GIDL).

Storage cells in the same location or position in different memory structures 329 (e.g., different memory strings 329) on different bit lines, in certain embodiments, can be on the same word line. Each word line can store one page of data, such as when 1-bit of data is stored per cell (SLC); two pages of data, such as when 2-bits of data are stored per cell (MLC); three pages of data, such as when 3-bits of data are stored per cell (TLC); four pages of data, such as when 4-bits of data are stored per cell (QLC); or another number of pages of data.

In the depicted embodiment, a vertical, 3D memory structure 329 comprises an "I" shaped memory structure 329. In other embodiments, a vertical, 3D memory structure 329 can comprise a "U" shaped structure or can have another vertical and/or stacked architecture. In certain embodiments, four sets of strings 329 (e.g., four sets of 48 word lines, or another predefined number of word lines) can form an erase block, while in other embodiments, fewer or more than four sets of strings 329 can form an erase block. As can be appreciated, any suitable number of storage cells can be part of a single string 329. In one embodiment, a single string 329 includes 48 storage cells.

Figure 4:
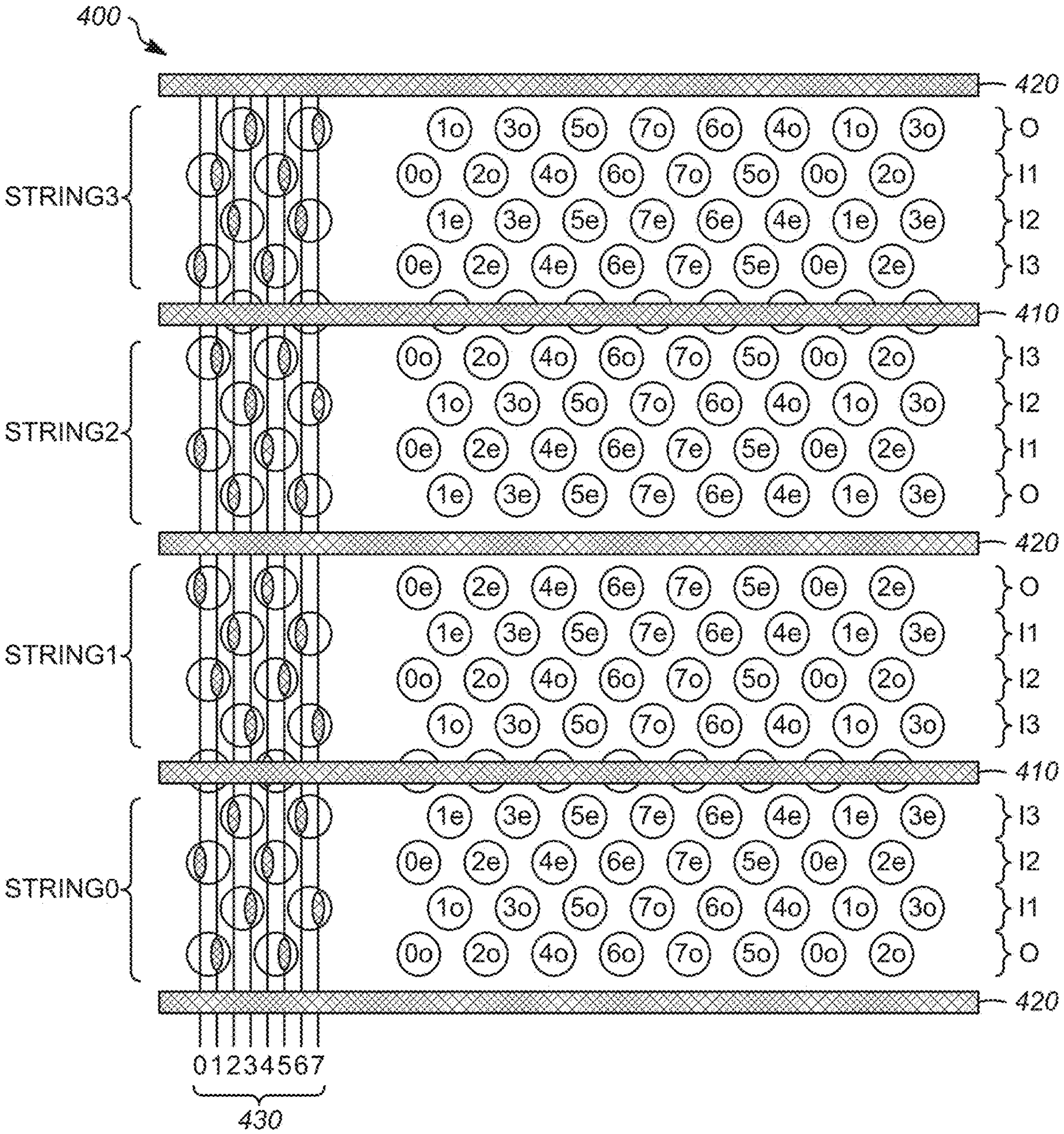
FIG. 4 illustrates a diagram showing a top view of a 3D memory block according to an example embodiment.

FIG. 4 is a diagram illustrating a top view of a 3D memory block 400, according to one embodiment. As illustrated, the 3D memory block 400 can comprise a series of memory holes or cells (represented by circles labeled "0o" to "7o" and "0e" to "7e" in FIG. 4). Each of these memory holes can be organized into strings (labeled as "String0" to "String3" in FIG. 4) and/or further organized into IO groups (labeled as "O," "I1," "I2," and "I3" in FIG. 4). Each IO group is located between two different types of etching features formed in the 3D memory block 400, a shallow etching feature 410 (e.g., called SHE), and a deep etching feature 420 (e.g., called ST). The IO groups adjacent to a deep etching feature 420 are labeled outer IO groups (O); the IO groups adjacent to a shallow etching feature 410 are labeled Inner3 IO groups (I3); the IO groups adjacent to the Outer IO groups are labeled Inner1 IO groups (I1); and the IO groups adjacent to the Inner3 IO groups (I3) are labeled Inner2 IO groups (I2). It should be noted that the procedures and methods disclosed herein can be implemented in connection with a wide variety of types of memory, such as NAND or NOR memory, 2D memory, 3D memory, or memory employing a charge-based or resistive-based storage technology. In one example, the illustrated memory block 400 can comprise 16K memory cells, which can be further segregated into smaller groups of memory cells comprising 1K memory cells each. These smaller groups can be arranged in tiers. The tiers can include the memory cells associated with the holes designated by the same designated circles in FIG. 4. The memory cells labeled as 2o are part of a same tier. The memory cells labeled 3e are part another tier. The memory cells labeled as 2e are part of a same tier. The memory cells labeled 3o are part another tier. As explained herein the controller can select a single tier for a program verify operation when the program verify level is unlikely to find an overprogrammed state or when the single tier is representative of the other tiers. At least one intermediate level for program verify is a multiple tier verify operation.

Some manufacturing processes for 3D memory can include film deposition processes that tend to dominate over etching processes performed during manufacturing. For these types of manufacturing processes, the outer memory holes in the Outer IO groups (O) will generally program slower than the inner memory hole (I3). However, other manufacturing processes for 3D memory can include etching processes that tend to dominate over film deposition processes during manufacturing. For these types of manufacturing processes, the inner memory hole (I3) will generally program slower than the outer memory holes (O). It should be noted, however, that the physical position of an IO group of memory cells within the 3D memory structure is not always dispositive of its relative programming speed due to this variation introduced during the manufacturing process or as a result of wear induced by usage of the device. Moreover, cycling degradation can also cause the relative programming speed of different memory cells, or groups of memory cells, to shift over time.

Continuing with FIG. 4, each of the memory holes (0o-7o and 0e-7e) can be connected to bit lines 430 (labeled as bit lines 0-7 in FIG. 4). The bit lines 430 extend above the memory holes and are connected to select memory holes via connection points (illustrated as small, solid ovals in FIG. 4) indicating where a bit line 430 connects to a memory hole. For ease of illustration, only eight bit lines 430 (0 to 7) are shown in FIG. 4. However, it will be understood that other bit lines (not shown) also extend above the other memory holes in FIG. 4.

Figure 5:
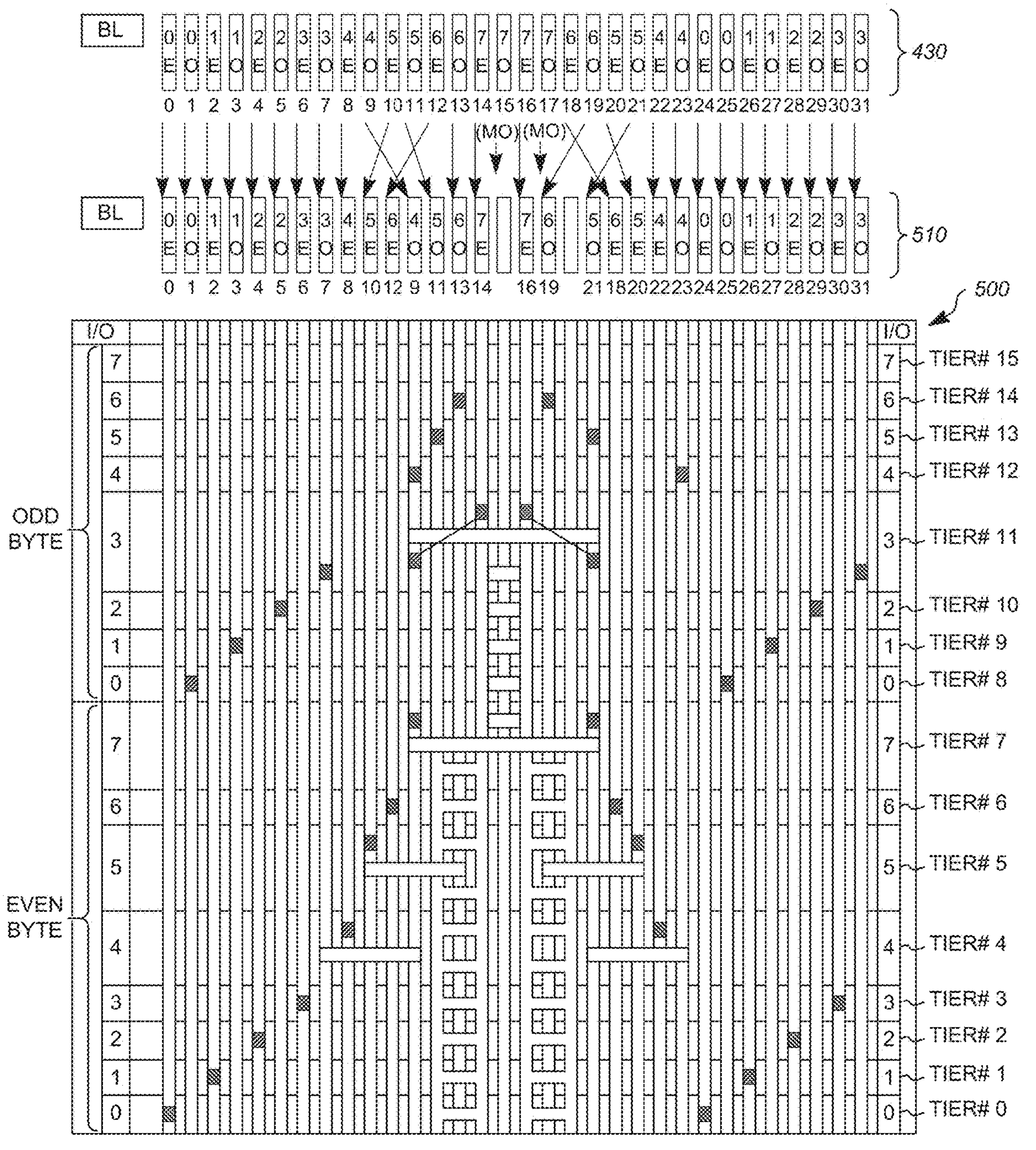
FIG. 5 illustrates an array of sense amplifier groups according to an exemplary embodiment for the 3D memory block of FIG. 4.

FIG. 5 illustrates an array of sense amplifier groups 500 for the 3D memory structure 400 of FIG. 4, according to one example. The bit lines 430 shown in FIG. 4 extend to the array of sense amplifier groups 500, as can be seen in FIG. 5. In this manner, certain memory holes of the 3D memory structure 400 can be electrically coupled to one of the bit lines 430, and each bit line can then be electrically coupled to a bit line interface 510. In an embodiment, the bit line interface 510 can additionally use scrambling, as illustrated by the angled/non-vertical lines shown in FIG. 5 between the bit lines 430 and the bit line interface 510. Thereafter, each bit line 430 can be electrically coupled to a sense amplifier group (labeled as Tier #0 to Tier #15 in FIG. 5). As illustrated in FIG. 5, each sense amplifier group extends horizontally across the page. Accordingly, each "tier" comprises a group of memory holes in electrical communication with a particular sense amplifier group via a bit line 430. A tier can also be referred to as a "subgroup of memory cells," or just a "subgroup." A "subgroup" of memory cells can be any subset of memory cells formed from a larger group of memory cells. In this application, a subgroup of memory cells can be referred to as a tier, a tier group, an IO group, a division, and the like.

Figure 6:
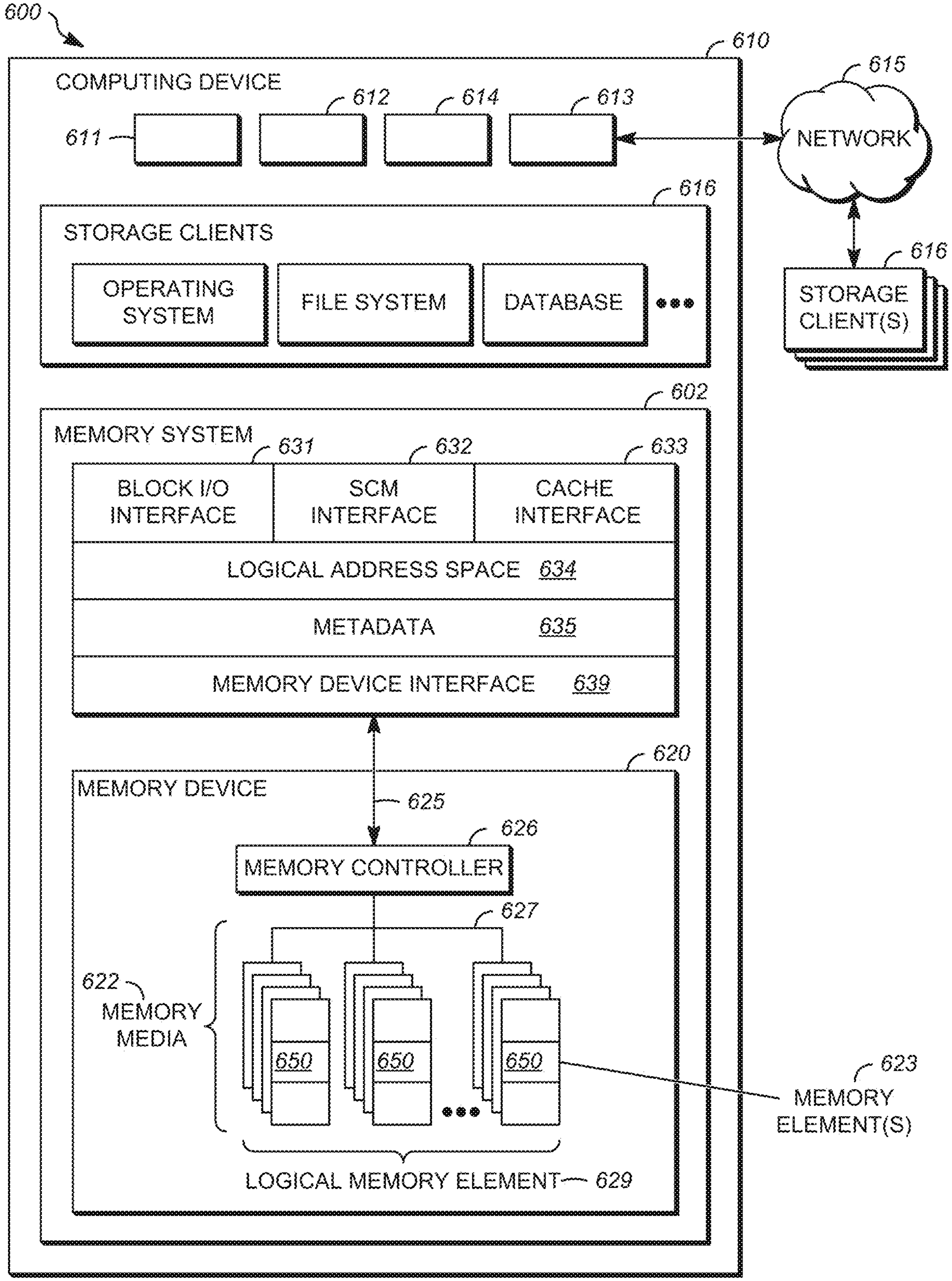
FIG. 6 illustrates a schematic block diagram illustrating an embodiment of a memory system according to an example embodiment.

FIG. 6 is a schematic block diagram illustrating an embodiment of a system 600 and device 610 for memory cell subgroup identification and selection. The computing device 610 comprises one or more identification circuits or tier selection circuits 650 for memory media 622 of a non-volatile and/or volatile memory device 620. As used herein, an "tier circuit" refers to a circuit utilized to identify a particular tier of memory cells (e.g., a 2o tier memory cells) in relation to at least one other subgroup or tier of memory cells and select the identified tier of memory cells for use in at least one programming operation, e.g., program verify. The tier selection circuits can operate to select a single tier for some program verify levels and multiple tiers for other program verify levels in a same verify operation. At least one verify is a single tier verify, e.g., the A or first program verify level. The first program verify level can be the lowest voltage. In an example embodiment, the last program verify level is also a single tier verify operation. In an example embodiment, at least one intermediate program verify is performed on multiple tiers.

A tier selection circuit 650 can be part of a non-volatile and/or volatile memory element 623 (e.g., disposed on a same integrated circuit device as a non-volatile memory media 622). In some embodiments, a memory device 620 can at least partially operate on and/or in communication with a nonvolatile and/or volatile memory system 602 of a computing device 610, which can comprise a processor 611, volatile memory 612, and a communication interface 613. The processor 611 can comprise one or more central processing units, one or more general-purpose processors, one or more application-specific processors, one or more virtual processors (e.g., the computing device 610 can be a virtual machine operating within a host), one or more processor cores, or the like. The communication interface 613 can comprise one or more network interfaces configured to communicatively couple the computing device 610 and/or memory controller 626 to a communication network 615, such as an Internet Protocol (IP) network, a Storage Area Network (SAN), wireless network, wired network, or the like.

The memory device 620, in various embodiments, can be disposed in one or more different locations relative to the computing device 610. In one embodiment, the memory device 620 comprises one or more non-volatile and/or volatile memory elements 623, such as semiconductor chips or packages or other integrated circuit devices disposed on one or more printed circuit boards, storage housings, and/or other mechanical and/or electrical support structures. For example, the memory device 620 can comprise one or more direct inline memory module (DIMM) cards, one or more expansion cards and/or daughter cards, a memory card, a universal serial bus (USB) drive, a solid-state-drive (SSD) or other hard drive device, and/or can have another memory and/or storage form factor. The memory device 620 can be integrated with and/or mounted on a motherboard of the computing device 610, installed in a port and/or slot of the computing device 610, installed on a different computing device 610 and/or a dedicated storage appliance on the network 615, in communication with the computing device 610 over an external bus (e.g., an external hard drive), or the like.

The memory device 620, in one embodiment, can be disposed on a memory bus of a processor 611 (e.g., on the same memory bus as the volatile memory 612, on a different memory bus from the volatile memory 612, in place of the volatile memory 612, or the like). In a further embodiment, the memory device 620 can be disposed on a peripheral bus of the computing device 610, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a Fire Wire bus, a Fibre Channel connection, a Universal Serial Bus (USB), a PCIe Advanced Switching (PCIe-AS) bus, or the like. In another embodiment, the memory device 620 can be disposed on a data network 615, such as an Ethernet network, an Infiniband network, SCSI RDMA over a network 615, a storage area network (SAN), a local area network (LAN), a wide area network (WAN) such as the Internet, another wired and/or wireless network 615, or the like.

The computing device 610 can further comprise a non-transitory, computer readable storage medium 614. The computer readable storage medium 614 can comprise executable instructions configured to cause the computing device 610 (e.g., processor 611) to perform steps of one or more of the methods disclosed herein. In one embodiment, a subgroup selection circuit 650 can comprise hardware of a non-volatile and/or volatile memory element 623, computer executable program code of a device driver, firmware of a memory controller 626 and/or a memory media controller for a memory element 623, another electrical component, or the like. In one embodiment, a subgroup selection circuit 650 is integrated on a memory element 623 (e.g., an on-die subgroup selection circuit 650 and/or other integrated hardware).

According to various embodiments, a memory controller 626 e.g., memory controller circuitry) can manage one or more memory devices 620 and/or memory elements 623, one or more of which can comprise an on-die subgroup selection circuit 650. The memory device(s) 620 can comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a memory device 620). Memory units and/or regions can include, but are not limited to: pages, memory divisions, blocks, sectors, collections or sets of physical storage locations (e.g., logical pages, logical blocks), or the like.

A device driver and/or the memory controller 626, in certain embodiments, can present a logical address space 634 to the storage clients 616. As used herein, a logical address space 634 refers to a logical representation of memory resources. The logical address space 634 can comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an I node, a Universally Unique Identifier (UUID), a Globally Unique Identifier (GUID), a hash code, a signature, an index entry, a range, an extent, or the like.

A device driver for the memory device 620 can maintain metadata 635, such as a logical to physical address mapping structure to map logical addresses of the logical address space 634 to media storage locations on the memory device (s) 620. A device driver can be configured to provide storage services to one or more storage clients 616. The storage clients 616 can include local storage clients 616 operating on the computing device 610 and/or remote storage clients 616 accessible via the network 615 and/or network interface 613. The storage clients 616 can include, but are not limited to: operating systems, file systems, database applications, server applications, kernel-level processes, user-level processes, applications, and the like.

A device driver can be communicatively coupled to one or more memory devices 620. The one or more memory devices 620 can include different types of memory devices including, but not limited to: solid-state storage devices, semiconductor storage devices, SAN storage resources, volatile memory devices, non-volatile memory devices, or the like. The one or more memory devices 620 can comprise one or more respective memory media controllers 626 and memory media 622. A device driver can provide access to the one or more memory devices 620 via a traditional block I/O interface 631. Additionally, a device driver can provide access to enhanced functionality through the SCM interface 632. The metadata 635 can be used to manage and/or track data operations performed through any of the Block I/O interface 631, SCM interface 632, cache interface 633, or other related interfaces.

The cache interface 633 can expose cache-specific features accessible via a device driver for the memory device 620. Also, in some embodiments, the SCM interface 632 presented to the storage clients 616 provides access to data transformations implemented by the one or more memory devices 620 and/or the one or more memory media controllers 626.

A device driver can present a logical address space 634 to the storage clients 616 through one or more interfaces. As discussed above, the logical address space 634 can comprise a plurality of logical addresses, each corresponding to respective media locations on one or more memory devices 620. A device driver can maintain metadata 635 comprising any-to-any mappings between logical addresses and media locations, or the like.

A device driver can further comprise and/or be in communication with a memory device interface 639 configured to transfer data, commands, and/or queries to the one or more memory devices 620 over a bus 625, which can include, but is not limited to: a memory bus of a processor 611, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 615, InfiniBand, SCSI RDMA, or the like. The memory device interface 639 can communicate with the one or more memory devices 620 using input-output control (IO-CTL) command(s), IO-CTL command extension(s), remote direct memory access, or the like.

The communication interface 613 can comprise one or more network interfaces configured to communicatively couple the computing device 610 and/or the memory controller 626 to a network 615 and/or to one or more remote, network-accessible storage clients 616. The storage clients 616 can include local storage clients 616 operating on the computing device 610 and/or remote storage clients 616 accessible via the network 615 and/or the network interface 613. The memory controller 626 is part of and/or in communication with one or more memory devices 620. Although FIG. 6 depicts a single memory device 620, the disclosure is not limited in this regard and could be adapted to incorporate any number of memory devices 620, a combination of one or more volatile memory devices 620 and one or more non-volatile memory devices 620, or the like.

The memory device 620 can comprise one or more elements 623 of memory media 622. In one embodiment, an element 623 of memory media 622 comprises a volatile memory medium 622, such as random-access memory (RAM), dynamic RAM (DRAM), synchronous DRAM (SDRAM), double data rate (DDR) SDRAM, static RAM (SRAM), thyristor RAM (T-RAM), zero-capacitor RAM (Z-RAM), or the like. In certain embodiments, an element 623 of memory media 622 comprises a non-volatile memory medium 622, such as ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS) memory, programmable metallization cell (PMC) memory, conductive-bridging RAM (CBRAM), magneto-resistive RAM (MRAM), magnetic storage media (e.g., hard disk, tape), optical storage media, or the like. Thus, the memory device 620 may rely, for example, on stored voltage levels or stored resistance levels. The one or more elements 623 of memory media 622, in certain embodiments, comprise storage class memory (SCM).

While legacy technologies such as NAND flash can be block and/or page addressable, storage class memory, in one embodiment, is byte addressable. In further embodiments, storage class memory can be faster and/or have a longer life (e.g., endurance) than NAND flash; can have a lower cost, use less power, and/or have a higher storage density than DRAM; or offer one or more other benefits or improvements when compared to other technologies. For example, storage class memory can comprise one or more non-volatile memory elements 623 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 622 is referred to herein as "memory media," in various embodiments, the non-volatile memory media 622 can more generally comprise one or more non-volatile recording media capable of recording data, which can be referred to as a non-volatile memory medium, a non-volatile storage medium, or the like. Further, the nonvolatile memory device 620, in various embodiments, can comprise a non-volatile recording device, a non-volatile memory device, a non-volatile storage device, or the like. Similarly, a nonvolatile memory element 623, in various embodiments, can comprise a non-volatile recording element, a non-volatile memory element, a non-volatile storage element, or the like.

The non-volatile memory media 622 can comprise one or more non-volatile memory elements 623, which can include, but are not limited to: chips, packages, planes, die, or the like. A non-volatile memory controller 626 can be configured to manage data operations on the nonvolatile memory media 622, and can comprise one or more processors, programmable processors (e.g., FPGAs), ASICs, microcontrollers, or the like. In some embodiments, the nonvolatile memory controller 626 is configured to store data on and/or read data from the nonvolatile memory media 622, to transfer data to/from the non-volatile memory device 620, and so on.

The non-volatile memory controller 626 can be communicatively coupled to the non-volatile memory media 622 by way of a bus 627. The bus 627 can comprise an I/O bus for communicating data to/from the non-volatile memory elements 623. The bus 627 can further comprise a control bus for communicating addressing, and other command and control information to the non-volatile memory elements 623. In some embodiments, the bus 627 can communicatively couple the non-volatile memory elements 623 to the non-volatile memory controller 626 in parallel. This parallel access can allow the non-volatile memory elements 623 to be managed as a group, forming a logical memory element 629. The logical memory element can be partitioned into respective logical memory units (e.g., logical pages) and/or logical memory divisions (e.g., logical blocks). The logical memory units can be formed by logically combining physical memory units of each of the non-volatile memory elements.

The non-volatile memory controller 626 can comprise and/or be in communication with a device driver executing on the computing device 610. A device driver can provide storage services to the storage clients 616 via one or more interfaces 631, 632, and/or 633. In some embodiments, a device driver provides a block-device I/O interface 631 through which storage clients 616 perform block-level I/O operations. Alternatively, or in addition, a device driver can provide a storage class memory (SCM) interface 632, which can provide other storage services to the storage clients 616. In some embodiments, the SCM interface 632 can comprise extensions to the block device interface 631 (e.g., storage clients 616 can access the SCM interface 632 through extensions or additions to the block device interface 631). Alternatively, or in addition, the SCM interface 632 can be provided as a separate API, service, and/or library. A device driver can be further configured to provide a cache interface 633 for caching data using the non-volatile memory system 602. A device driver can further comprise a non-volatile memory device interface 639 that is configured to transfer data, commands, and/or queries to the non-volatile memory controller 626 over a bus 625, as described above.

Figure 7:
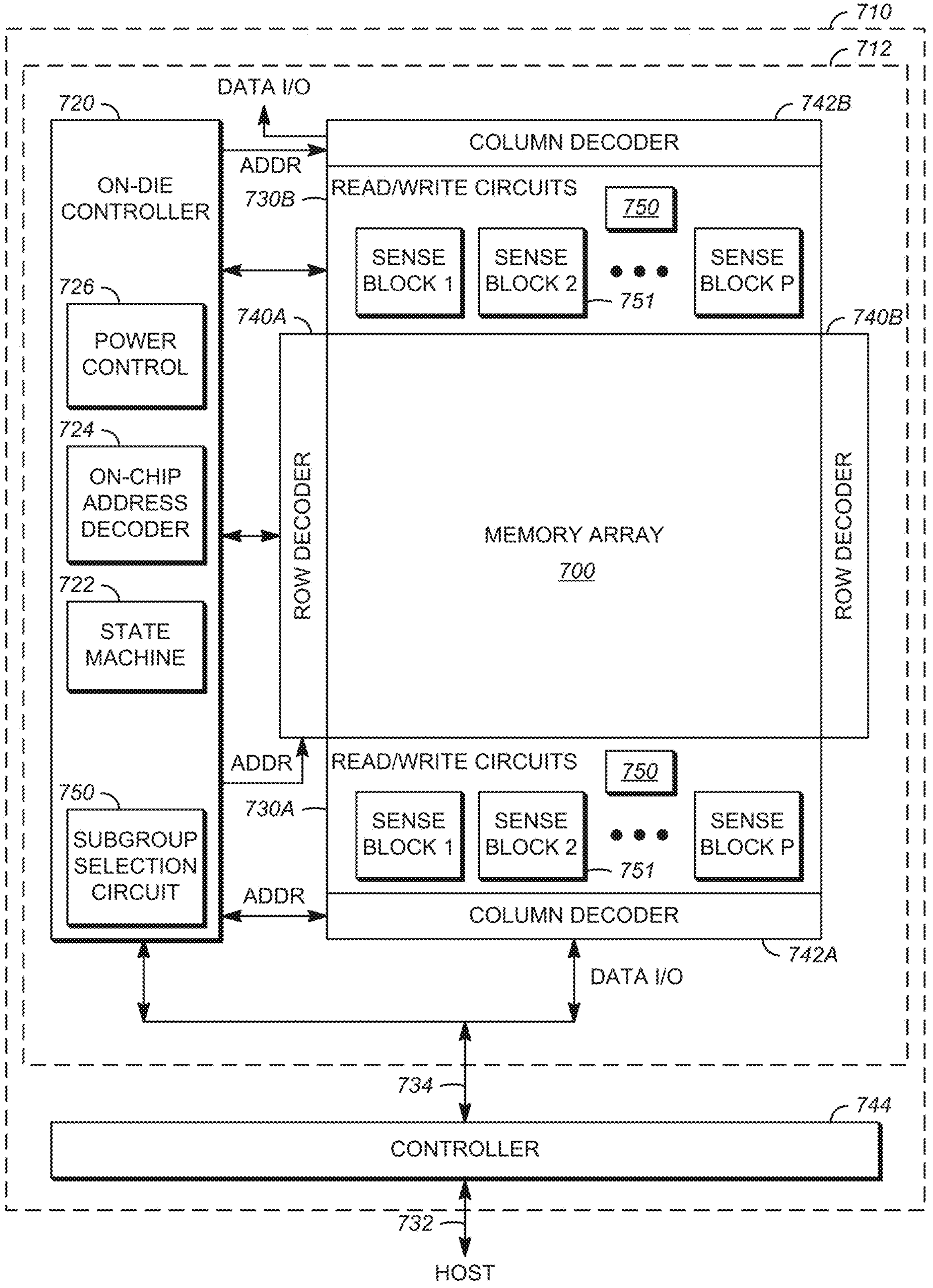
FIG. 7 illustrates a schematic block diagram of non-volatile storage device for memory cell subgroup identification and selection according to an example embodiment.

FIG. 7 is a schematic block diagram illustrating an embodiment of a non-volatile storage device 710, which can perform programming and verify operations as described herein. The non-volatile storage device 710 can include one or more memory die or chips 712 "memory die" comprises a block of semiconducting material on which a memory circuit is fabricated and, as used herein, also includes the memory circuit disposed thereon. The nonvolatile storage device 710 can be substantially similar to the computing device 610 described with reference to FIG. 6.

The memory die 712, in some embodiments, includes an array 700 (e.g., two-dimensional or three dimensional) of memory cells, an on-die controller 720, and read/write circuits 730A/730B. In one embodiment, access to the memory array 700 by the various peripheral circuits is implemented in a symmetric fashion, on opposite sides of the memory array 700, so that the densities of access lines and circuitry on each side are reduced by half. The read/write circuits 730A/730B, in a further embodiment, include multiple sense blocks 751 which allow a page of memory cells to be read or programmed in parallel.

The memory array 700, in various embodiments, is addressable by word lines via row decoder circuits 740A/740B and by bit lines via column decoder circuits 742A/742B. In some embodiments, a controller 744 is included in the same memory device 710 (e.g., a removable storage card or package) as the one or more memory die 712. Commands and data are transferred between the host and controller 744 via lines 732 and between the controller and the one or more memory die 712 via lines 734. One implementation can include multiple chips 712.

On-die controller 720, in one embodiment, cooperates with the read/write circuits 730A/730B to perform memory operations on the memory array 700. The on-die controller 720, in certain embodiments, includes a state machine 722, an on-chip address decoder 724, a power control circuit 726, and a subgroup selection circuit 750. In one embodiment, the on-chip address decoder 724 and/or the power control circuit 726 can be part of and/or controlled by the controller 744. The on-die controller 720 an operate to select certain single tiers for certain program verify levels and multiple tiers for other program verify levels.

The state machine 722, in one embodiment, provides chip-level control of memory operations. The on-chip address decoder 724 provides an address interface to convert between the address that is used by the host or a memory controller to the hardware address used by the decoder circuits 740A, 740B, 742A, 742B. The power control circuit 726 controls the power and voltages supplied to the word lines and bit lines during memory operations. In one embodiment, the power control circuit 726 includes one or more charge pumps that can create voltages larger than the supply voltage. The state machine can be used to count the bitscans and compare the result to the threshold value, which can be stored in the state machine. The state machine can also trigger the program verify operation to skip to the next memory level verify operation when the bitscan count exceeds the threshold value.

In an embodiment, one or any combination of the on-die controller 720, state machine 722, power control circuit 726, on-chip address decoder 724, decoder circuit 742 A, decoder circuit 742B, decoder circuit 740 A, decoder circuit 740B, read/write circuits 730A, read/write circuits 730B, and/or controller 744 can be referred to as one or more managing circuits or generally as a controller circuitry. In an example embodiment, the controller circuitry can include the word line switches electrically connected and isolating the word lines from the control gate lines.

Figure 8:
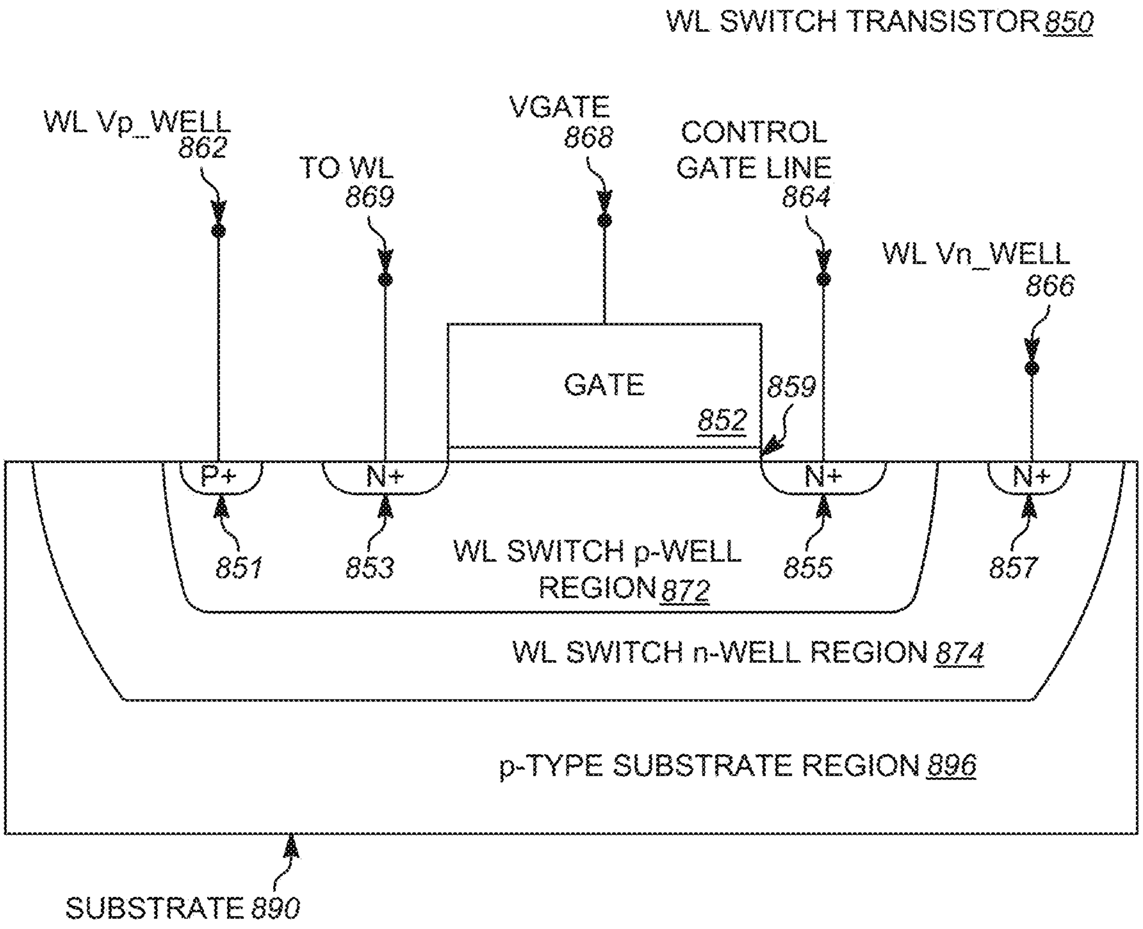
FIG. 8 illustrates a word line select transistor according to an example embodiment.

FIG. 8 shows an embodiment of a word line switch transistor 850, which may be used to provide a voltage to a word line. The word line switch transistor can receive a word voltage from a word line driven by a power source in the memory controller and connect that voltage to the control gate line. In an embodiment, the substrate 890 employs a triple-well technology which includes a WL switch p-well region 872 within a WL switch n-well region 874 that in turn is within a p-type substrate region 896. The p-type substrate region 896 may be a different part of the same p-type substrate region as the NAND string. However, the WL switch n-well region 874, and WL switch p-well region 872 are separate from the array n-well region 894 and the array p-well region 872 that the NAND strings are formed in. Therefore, the wells 872, 874 of the WL switch transistor 850 may be independently biased from the wells the NAND strings are in.

The WL switch p-well region 872 has a P+ region 851 in one embodiment to provide better electrical contact to terminal 862 for applying the voltage WL VP-WELL. The n-well region 874 has an N+ region 857 in one embodiment to provide better electrical contact to terminal 866 for applying WL VN-WELL 866. In one embodiment, WL VP-WELL is a negative voltage during various operations. However, note that it is not necessarily maintained at the same voltage throughout operation. For example, a different negative voltage might be used for program than for read. In one embodiment, WL VN-WELL is set to VDD (e.g., 3.2V) during program operations; however, another voltage could be used. In an embodiment, the p-type substrate region 896 remains grounded while operating the memory device.

In this embodiment, the WL switch transistor 850 has two N+ regions 853, 855, one of which may be a source and the other a drain. One N+ region 853 is connected to one of the word lines in the memory array 100 or 226 via terminal 869. The word lines in these views are connected to control gates and are the control gate lines. A control gate voltage (CG line) may be applied to the other N+ region 855 via control gate line terminal 864. The transistor has a gate 852 over a gate oxide 859. A voltage VGATE may be applied to the gate 852 via terminal 868. In one embodiment, a "select voltage" VSELECT is applied to the gate 852 to turn transistor 850 ON, and an "unseled voltage" VUNSELECT is applied to the gate 852 to keep transistor 850 OFF. If a select voltage is used to turn ON the transistor 850, CG line voltage may be passed through to the word line. In one embodiment, the threshold voltage of the WL switch transistor 850 is negative when the substrate bias (e.g., p-well bias) is zero volts.

When programming, CG line voltage may be the program voltage (e.g., VPGM), which may be passed to the selected word line. This is assuming that the WL switch transistor 850 is used to select a word line. The WL switch transistor 850 may also be used to provide a voltage VPASS to unselected word lines during programming. During a read operation, the CG line voltage may be a read compare voltage (e.g., VCGRV) that is passed to the selected word line. For unselected word lines, CG line may be Vread. During erase, a word line erase voltage (e.g., VWL-ERASE) may be provided to word lines in blocks that are selected for erase by using VWL-ERASE from CG line. Note that the WL switch transistor 850 is typically not used to pass a voltage to the word lines in blocks that are not selected for erase.

Figure 9:
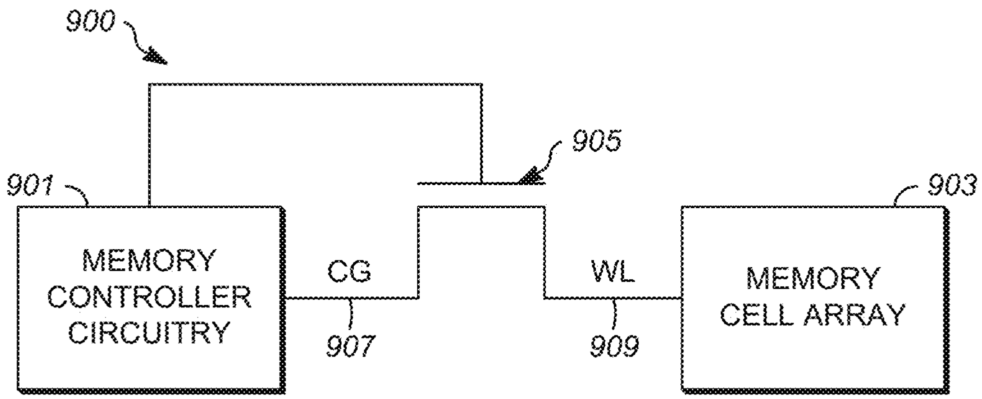
FIG. 9 illustrates a schematic view of a control gate, word line connection according to an example embodiment.

FIG. 9 shows a schematic view of a nonvolatile memory system 900 including a memory controller 901 in electrical communication with a memory cell array 903. The memory controller 901 can be the controller circuitry as shown in FIGS. 6-7 and related description. The memory array 903 can be the memory array 100, 126 as shown in FIG. 1 and FIG. 2 respectively and include the memory structures shown in FIGS. 3-5, and related description herein. The memory controller circuitry 901 controls the state of the word line switch 905. The word line switch 905 operates to connect the control gate line 907 to one or more word lines 909. The control gate line 907 is held at a non-zero voltage, e.g., a control gate ready level, and when a word line requires charge the control gate line can be precharged to quickly supply the word line with the appropriate voltage signal through the word line switch 905. In a power-off mode or passive mode, the word line 909 may leak charge through the word line switch 905 to the control gate line 907.

Figure 11:
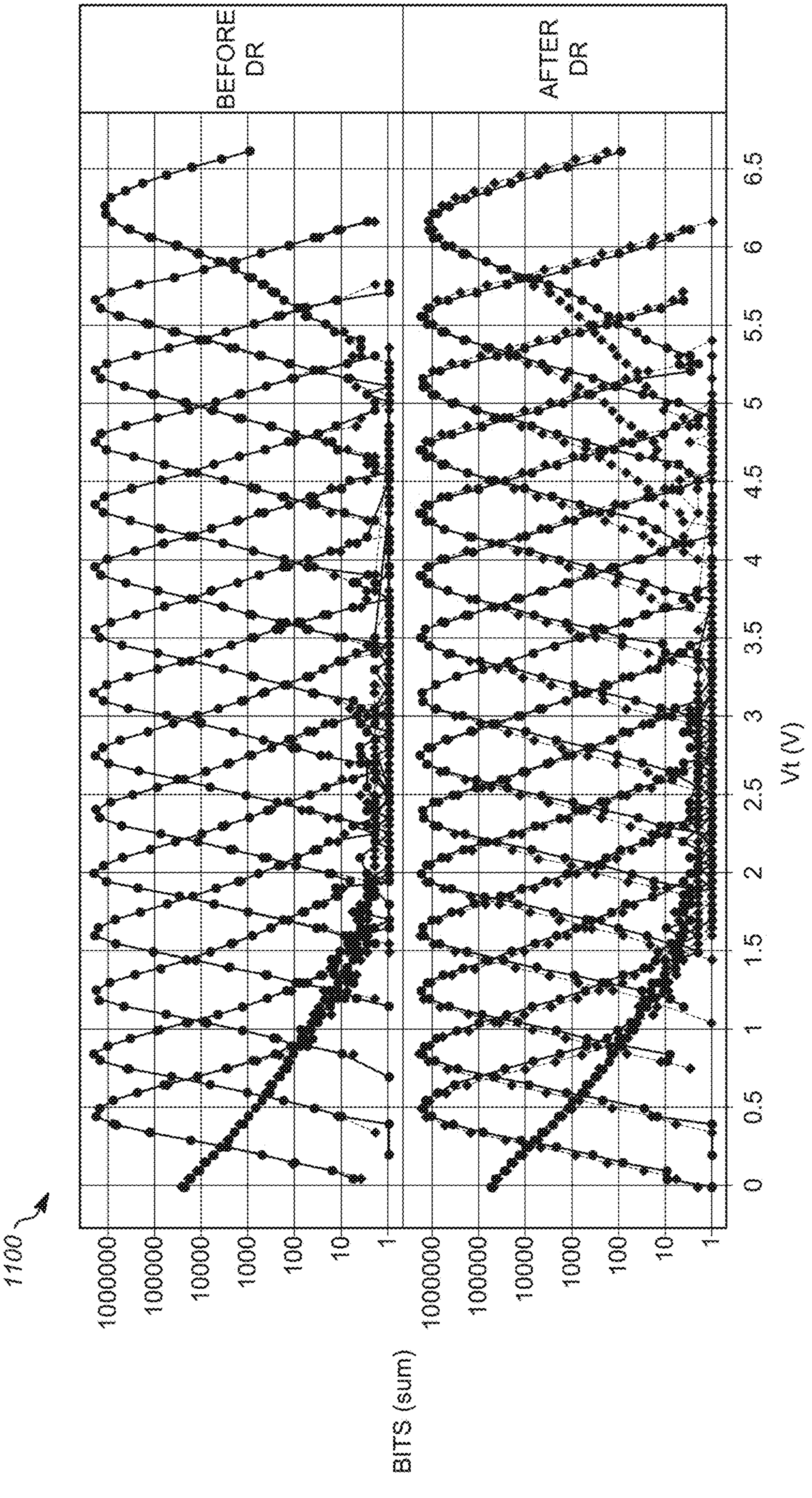
FIG. 11 illustrates a bit count scan according to an example embodiment.

In operation, when the nonvolatile memory, e.g., the entire memory chip, is powered-off or goes to a passive mode (where background operations, such as refresh are not performed) positive potentials on the word lines discharge by leaking charge away through the word line switches 905, e.g., transistors with the source and drains connected to the control gate line and the word line. When the memory is in the ON mode and active, the word lines are maintained at high potential of about four volts (4 V) to about five volts (5 V). If these voltages are allowed to leak, however, low residual word line potential may cause broad voltage threshold distribution for higher memory states with a spread-over lower tail due to charge leak via the tunnel oxide (see the curve with diamonds and dashed lines in FIG. 11). FIG. 11 also shows that keeping word lines at a higher potential (see the curve with circles and solid lines) improves data retention by minimizing charge loss. But, in power-off/passive mode, a read refresh operation cannot be performed. Read refresh is a commonly used method to keep the word line potentials high by performing regular dummy reads. Accordingly, there is a need to maintain high residual word line potential for as long as possible even during a power-off mode and a passive mode. Extending the time it takes for a word line to leak its charge can be accomplished by the methodology and structures described herein, e.g., charging the control gate line with the word line switch off when a shut off or enter passive mode operation is performed.

Figure 10:
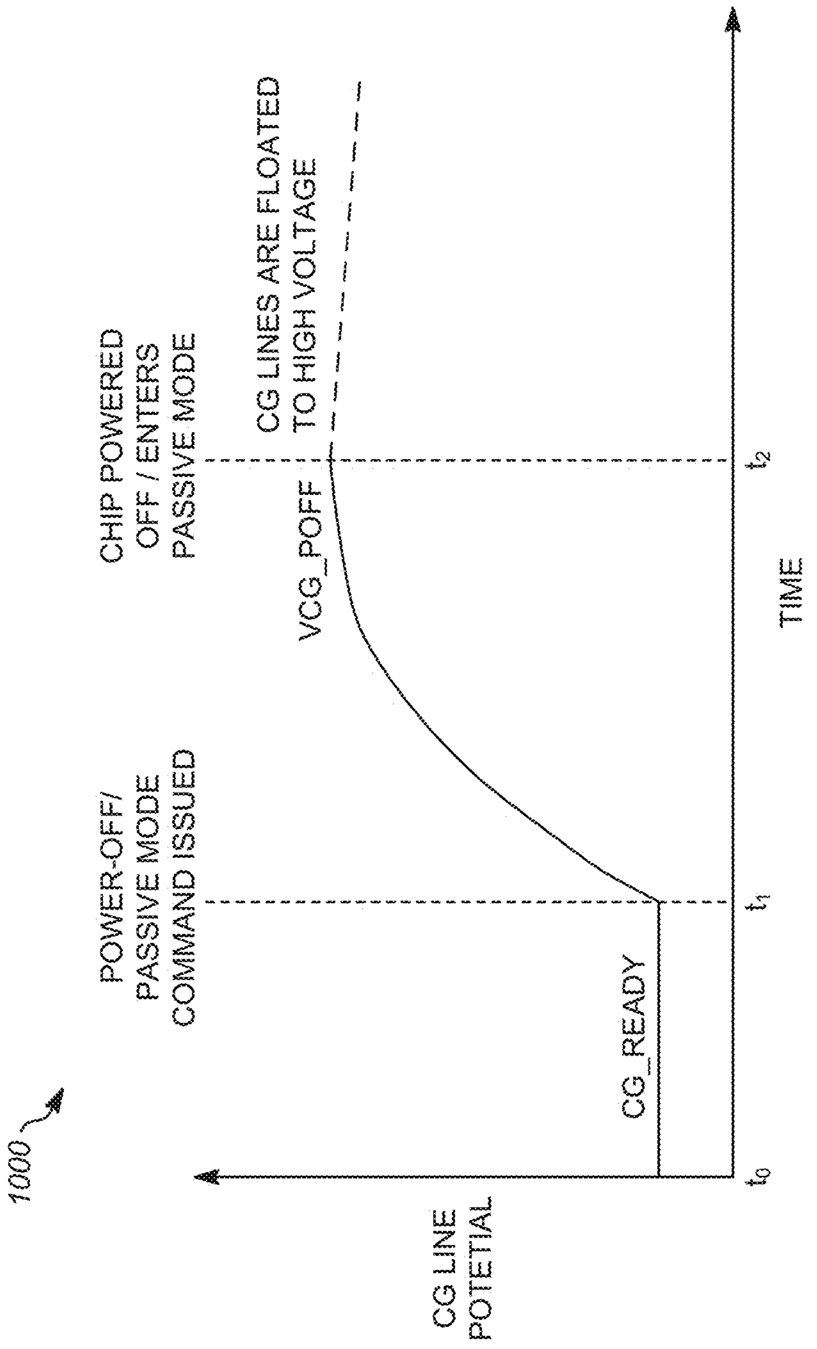
FIG. 10 illustrates a timing diagram for charging a control gate line according to an example embodiment.

FIG. 10 shows a graph 1000 of the control line potential as a function of time. At time t0, the control gate is held at a control gate ready (CG_ready) potential, which can be at, for example, zero volts, a half volt, or one volt. In an example embodiment, the CG_ready voltage is a non-zero voltage, e.g., less than three volts. At time t1, a command to change the mode of the nonvolatile memory from an ON mode to a non-active mode is received. The ON mode is when the nonvolatile memory can conduct program, verify, refresh, and read operations. During the ON mode the control gate line can be used to drive a signal to the word line or multiple word lines through the word line switch. The non-active mode can include either a power-off mode or a passive mode. The power-off mode turns the memory OFF. The passive mode is a reduced power mode without any background operations or it can be a reduced power mode that may perform some refresh operations and be a low power state that returns to active mode faster than the power-off mode. At time t1, memory controller check to see that all of the word line select switches are off (transistors are not conducting). If all word line selection switches are off, then the control gate lines are powered to a control gate power off voltage (VCG_POFF) over a time period. At time t2, the VCG_POFF voltage level is reached and the memory is placed in the appropriate not-ON mode (either the power-off mode or the passive mode). After time t2, the CG lines are floated and not electrically connected to any sink or power supply. After time t2, the CG line will assist in reducing the rate of charge leakage from the associated word lines, e.g., through the word line selection switch. Over time, the potential (voltage level) on the control gate line will leak and be reduced.

In a type of passive mode, the memory (e.g., the chip) can awaken and refresh the control gate line to the VCG_POFF after the time t2. The memory can awaken to a refresh mode that is not fully powered but can power the memory controller circuitry to ensure the word line switches are off and power the control gate line to the VCG_POFF level. The memory can awaken when a control parameter is met. The control parameter can be a time period. The time period can be the lowest time threshold at which the VCG_POFF falls to a voltage threshold, e.g., about CG_READY voltage level or a voltage level at which the rate of leakage from the word line increases. The control parameter can be a control gate voltage threshold. The control gate voltage threshold can be the CG_READY voltage and the memory controller circuitry can sense when the control gate line voltage falls to the voltage threshold and then awaken to recharge the control gate line to VCG_POFF after ensuring the word line switches are off. The memory controller can ensure that the word line switches are off by only permitting the control gate line refresh when it is powered up from the sensing of the control parameter.

FIG. 11 shows a nonvolatile memory bit scan count plot 1100 with two stacked graphs of the bit scan count as a function of the threshold voltage of the memory cells. The top graph is when the data is written before data retention operations. The bottom graph shows the bit scan count after ten hours of data retention test. Both graphs show the memory cells at 85 deg. C. Each graph has a two curves with a first curve (the curve with diamonds and dashed lines) depicting low word line potential and a second curve (the curve with circles and solid lines) showing high word line potential. The first curve shows a very low residual word line potential causes broad threshold voltage (Vt) distribution for higher states with a spread-over lower tail due to charge leakage via the tunnel oxide (which is next to the charge trapping layer, e.g., the floating gate). The plot 1100 clearly shows that keeping the word lines at a higher potential (the second curve) improves data retention by minimizing charge loss. The charge loss can be to the word line when the potential at the word line drops low.

Figure 12:
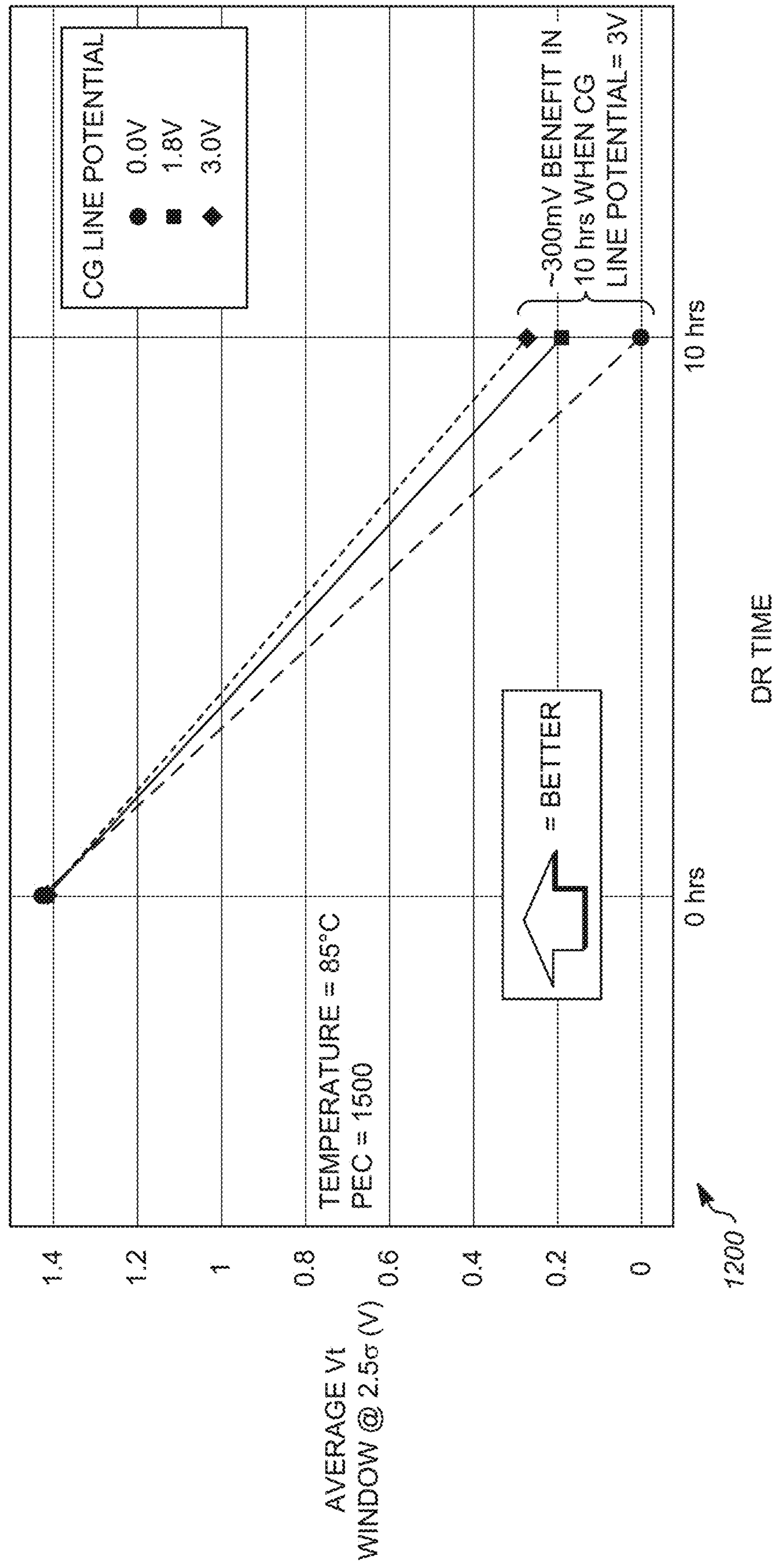
FIG. 12 illustrates a graph of testing results when using the control gate charging before entering a non-ON mode according to an example embodiment.

FIG. 12 shows a graph 1200 of the average threshold window as a function for data retention time. Here the higher on the graph the better, At the start time (here, zero hours), there is essentially no difference in the average voltage threshold window with any of the three control gate line potentials (here, 0.0 volts, 1.8 volts and 3.0 volts. However, after ten hors of data retention there is a 300 mV difference between the Vt window for memory cells associated with word lines that are connected to control gate lines that are held at a higher voltage, see the difference between the CG 3.0 volt line and the CG 0.0 volt line. By having a potential on the control gate lines to reduce the leakage from the associated word lines, charge can be retained in the memory cells as evidenced by the better average VT window.

Figure 13:
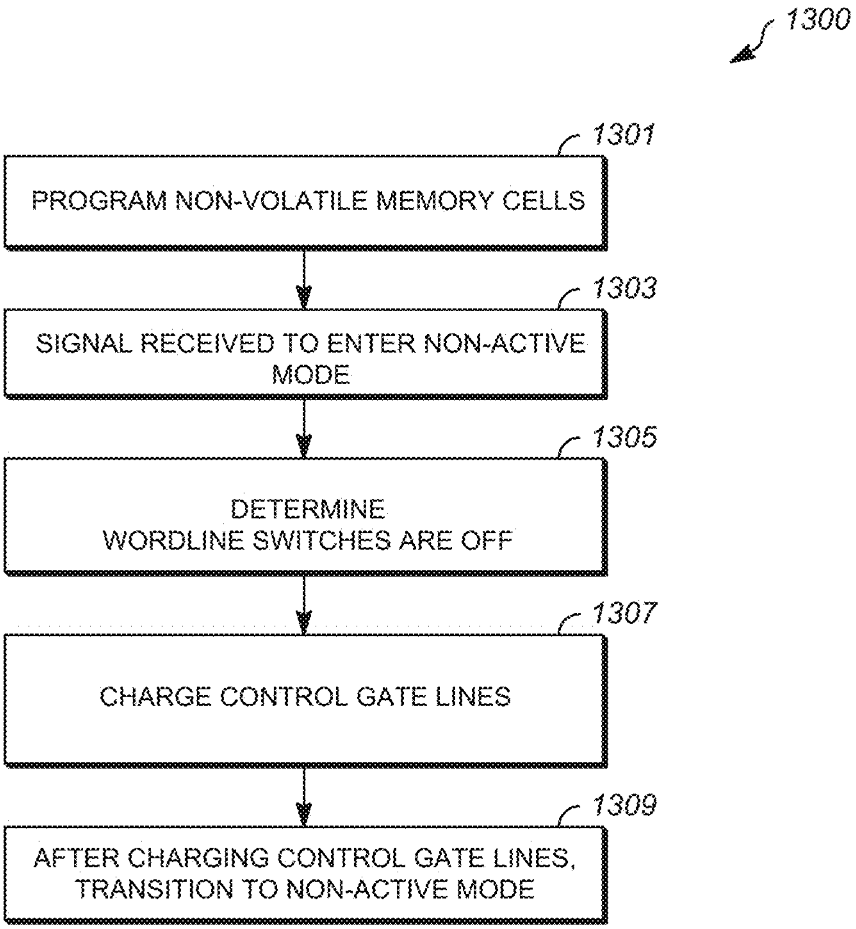
FIG. 13 illustrates a process for increasing data retention according to an example embodiment.

FIG. 13 shows a process flow 1300 for a data retention operation according to an example embodiment. At step 1301, nonvolatile memory cells are programmed during an active mode using a word line signal. A non-active mode can include a power OFF of the device or a passive mode where data refresh and other operations are not performed. At step 1303, a signal to transition to a non-active mode is received. At step 1305, the memory controller can determine that all word line switches are off. The word lines and the control gate lines are electrically isolated with the word line switches being off. At step 1307, with the word line switches being off, the control gate lines are charged to a non-zero potential (voltage). At step 1309, after charging the control gate line, the memory transitions to a non-active mode. Charging the control gate line can operate to delay charge leakage of the word line through the word line selection switch.

In an example embodiment, with the non-active mode being a passive mode, the control gate line is re-charged when a control parameter is met.

In an example embodiment, the control parameter is a refresh time period.

In an example embodiment, the control parameter is a voltage refresh threshold.

In an example embodiment, a method of delaying charge leakage in a word line of a nonvolatile memory is described. The method can include storing data in a plurality of nonvolatile memory cells configured to store multiple states, using a word line to access selected ones of the non-volatile memory cells, and supplying a control gate signal on a control gate line.

In an example embodiment, the conductivity of a word line switch connected between the word line and the control gate line is to control the potential applied to the word line from the control gate line.

In an example embodiment, when entering a non-ON mode, all of word line switches are placed in a nonconducting state. Thereafter, the control gate line is charged to a charged potential.

In an example embodiment, charging of the control gate line acts to reduce leaked charge from the word line through the word line switch to the control gate line.

In an example embodiment, the method can include charging the control gate line includes floating the control gate line when the memory is in the non-ON mode.

In an example embodiment, the non-ON mode is a passive mode; and the method further includes re-charging the control gate line when a control parameter is met.

In an example embodiment, wherein the non-ON state is a passive state and the method further includes placing all of word line switches in an OFF state.

In an example embodiment, wherein the non-ON state is an OFF state and the method further includes placing all of word line switches in a floating state.

Computer program code for carrying out operations for aspects of the present disclosure can be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code can execute partly or entirely on one or more of a user's computer and/or on a remote computer or server over a data network or the like. A component, as used herein, comprises a tangible, physical, non-transitory device. For example, a component can be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component can also be implemented in programmable hardware devices such as field programmable gate arrays, programmable array logic, programmable logic devices, or the like. A component can comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, can alternatively be embodied by or implemented as a component.

A circuit or circuitry, as used herein, comprises a set of one or more electrical and/or electronic components providing one or more pathways for electrical current. In certain embodiments, a circuit can include a return pathway for electrical current, so that the circuit is a closed loop. In another embodiment, however, a set of components that does not include a return pathway for electrical current can be referred to as a circuit (e.g., an open loop). For example, an integrated circuit can be referred to as a circuit regardless of whether the integrated circuit is coupled to ground (as a return pathway for electrical current) or not. In various embodiments, a circuit can include a portion of an integrated circuit, an integrated circuit, a set of integrated circuits, a set of non-integrated electrical and/or electrical components with or without integrated circuit devices, or the like. In an embodiment, a circuit can include custom VLSI circuits, gate arrays, logic circuits, or other integrated circuits; off-the-shelf semiconductors such as logic chips, transistors, or other discrete devices; and/or other mechanical or electrical devices. A circuit can also be implemented as a synthesized circuit in a programmable hardware device such as field programmable gate array, programmable array logic, programmable logic device, or the like (e.g., as firmware, a netlist, or the like). A circuit can comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, can be embodied by or implemented as a circuit.

By way of introduction, the following brief definitions are provided for various terms used in this application. Additional definitions will be provided in the context of the discussion of the figures herein. As used herein, "exemplary" can indicate an example, an implementation, and/or an aspect, and should not be construed as limiting or as indicating a preference or a preferred implementation. Further, it is to be appreciated that certain ordinal terms (e.g., "first" or "second") can be provided for identification and ease of reference and may not necessarily imply physical characteristics or ordering. Therefore, as used herein, an ordinal term (e.g., "first," "second," "third") used to modify an element, such as a structure, a component, an operation, etc., does not necessarily indicate priority or order of the element with respect to another element, but rather distinguishes the element from another element having a same name (but for use of the ordinal term). In addition, as used herein, indefinite articles ("a" and "an") can indicate "one or more" rather than "one." As used herein, a structure or operation that "comprises" or "includes" an element can include one or more other elements not explicitly recited. Thus, the terms "including," "comprising," "having," and variations thereof signify "including but not limited to" unless expressly specified otherwise. The terms "a," "an," and "the" also refer to "one or more" unless expressly specified otherwise. Further, an operation performed "based on" a condition or event can also be performed based on one or more other conditions or events not explicitly recited. As used in this application, the terms "an embodiment," "one embodiment," "another embodiment," or analogous language do not refer to a single variation of the disclosed subject matter; instead, this language refers to variations of the disclosed subject matter that can be applied and used with a number of different implementations of the disclosed subject matter. An enumerated listing of items does not imply that any or all of the items are mutually exclusive and/or mutually inclusive, unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions can be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. Other steps and methods can be conceived that are equivalent in function, logic, or effect to one or more blocks, or portions thereof, of the illustrated figures. Although various arrow types and line types can be employed in the flowchart and/or block diagrams, they are understood not to limit the scope of the corresponding embodiments. For instance, an arrow can indicate a waiting or monitoring period of unspecified duration between enumerated steps of the depicted embodiment.

As used herein, a "memory cell" comprises a hardware component that may store a single state. The memory cell may comprise a volatile or a non-volatile memory cell. The state stored in memory cell may represent one of various types of values, such as a single-bit value or a multi-bit value In the preceding detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure can refer to elements of proceeding figures. Like numbers can refer to like elements in the figures, including alternate embodiments of like elements.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. A nonvolatile memory control method, comprising:

programming nonvolatile memory cells during an active mode using a word line signal;

receiving a signal to transition to a non-active mode;

determining that word line switches are off;

charging a control gate line to a non-zero potential; and after charging the control gate line, transitioning the nonvolatile memory to the non-active mode.

2. The method of claim 1, wherein charging the control gate line operates to delay charge leakage of the word line.

3. The method of claim 2, wherein the non-active mode is a passive mode, and further comprising re-charging the control gate line when a control parameter is met.

4. The method of claim 2, wherein the non-active mode is an off mode.

5. The method of claim 3, wherein the control parameter is a refresh time period.

6. The method of claim 3, wherein the control parameter is a voltage refresh threshold.

7. A nonvolatile memory device, comprising:

a plurality of memory cells arranged in a plurality of word lines;

a plurality of word line switches connected to the word lines and a plurality of control gate lines;

control circuitry configured to:

program the plurality of memory cells using a word line signal while the nonvolatile memory device is in an active mode;

receive a signal to transition the nonvolatile memory device from the active mode to a non-active mode;

determine that the word line switches are off;

charge the plurality of control gate lines to a non-zero potential; and after charging the plurality of control gate lines, transition the nonvolatile memory device to the non-active mode.

8. The nonvolatile memory device of claim 7, wherein charging the control gate line operates to delay charge leakage of the word line.

9. The nonvolatile memory device of claim 8, wherein the non-active mode is a passive mode, and wherein the control circuitry is further configured to re-charge the control gate line when a control parameter is met.

10. The nonvolatile memory device of claim 9, wherein the control parameter is a refresh time period.

11. The nonvolatile memory device of claim 9, wherein the control parameter is a voltage refresh threshold.

12. The nonvolatile memory device of claim 8, wherein the non-active mode is an off mode.

13. The nonvolatile memory device of claim 7, wherein the control circuitry is configured to maintain the plurality of word lines at a high potential when the nonvolatile memory device is in the active mode and is configured to control the plurality of control gate lines to a non-zero voltage when transitioning to the non-active mode.

14. The nonvolatile memory device of claim 7, wherein the control circuitry is configured to float the plurality of control gate lines when the nonvolatile memory device is in the non-active mode.

* * * * *